United States Patent
Akioka et al.

(10) Patent No.: US 6,538,933 B2
(45) Date of Patent: Mar. 25, 2003

(54) HIGH SPEED SEMICONDUCTOR MEMORY DEVICE WITH SHORT WORD LINE SWITCHING TIME

(75) Inventors: Takashi Akioka, Akishima (JP); Masao Shinozaki, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/034,076

(22) Filed: Jan. 3, 2002

(65) Prior Publication Data

US 2002/0089881 A1 Jul. 11, 2002

Related U.S. Application Data

(63) Continuation of application No. 09/653,900, filed on Sep. 1, 2000, now Pat. No. 6,366,507.

(30) Foreign Application Priority Data

Sep. 30, 1999 (JP) .......................................... 11-278285

(51) Int. Cl.[7] .............................................. G11C 7/00
(52) U.S. Cl. ................... 365/194; 365/207; 365/230.08
(58) Field of Search ............................... 365/194, 207, 365/230.08, 189.01, 230.01

(56) References Cited

U.S. PATENT DOCUMENTS 6,108,793 A * 8/2000 Fujii et al. ................... 365/193
6,172,919 B1 * 1/2001 Horikawa ..................... 713/400

FOREIGN PATENT DOCUMENTS

| JP | 4-28084 | 1/1992 |
| JP | 7-21776 | 1/1995 |
| JP | 11-003593 A | 4/1998 |

* cited by examiner

Primary Examiner—Hoai Ho

(57) ABSTRACT

Setting means (such as fuse circuits) for adjusting the timings of various signals such as an activation timing of a sense amplifier, a fall timing of a word line, a recovery operation (equalization) of a bit lines and so forth, checking an operation in a test stage of a chip, and permanently programming (fixing) the timing of an internal signal to the condition of the highest operation speed that can be confirmed as acquirable in this check stage, is provided.

26 Claims, 16 Drawing Sheets

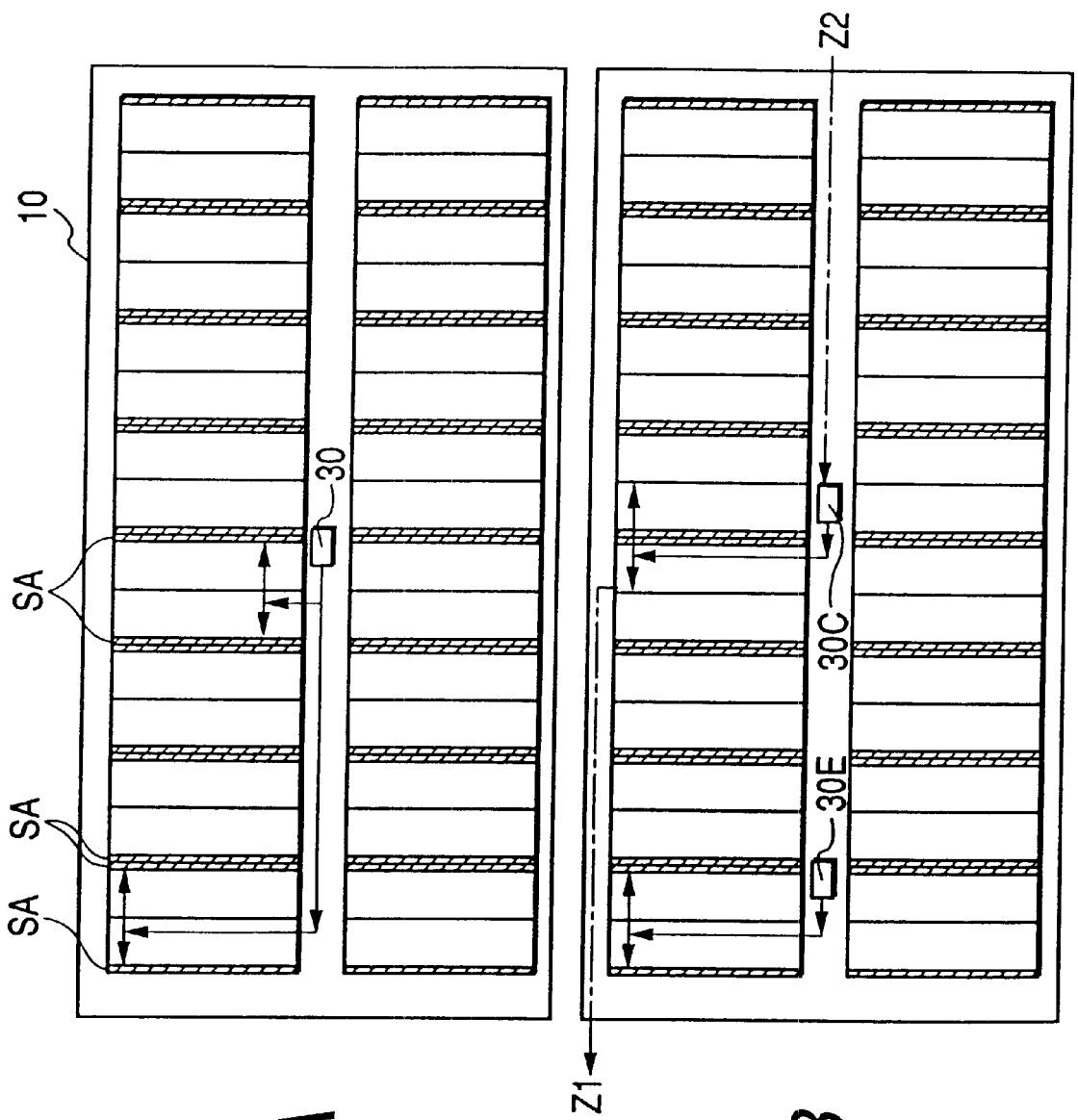

HIGH SPEED SEMICONDUCTOR MEMORY DEVICE WITH SHORT WORD LINE SWITCHING TIME

BACKGROUND OF THE INVENTION

This is a continuation application of U.S. application Ser. No. 09/653,900 filed on Sep. 1, 2000, now Pat. No. 6,366,507.

This invention relates to a technology for improving an operation speed of a semiconductor memory device. More particularly, this invention relates to a technology that will be effective when used for semiconductor memory devices for which a high-speed operation is required, such as a clock synchronization type SRAM (Static Random Access Memory) and a dynamic RAM.

A memory access time and a cycle time are two important performance factors that determine high-speed performance of semiconductor memory devices such as SRAM (hereinafter called merely the "semiconductor memory" or the "memory"). The term "memory access time" means the time necessary for an address signal, a clock signal, etc, that are inputted from outside the memory to flow through a path for selecting the memory cell and to output desired data. The term "cycle time" means the time of the minimum cycle in which operations such as read and write operations can be executed normally.

FIG. 16 shows the construction of a synchronous SRAM the inventor of the present invention examined prior to the resent invention. An address input register 11u holds an address signal inputted from an address input buffer 22u at the timing at which a clock signal changes. A decoder 12u decodes this input address, and corresponding word line WL and bit lines BL, /BL are selected. Consequently, a memory cell MC connected to the selected word line and bit lines causes a read current to flow and generates a small potential difference in the selected bit lines. A sense amplifier 13u amplifies this relatively small potential difference and sends it as read data to an output register 14u. The data is sent from the output register 14u to an output buffer 15u at the timing at which the clock signal reaches the output register, and is outputted outside the memory chip.

Japanese Patent Laid-Cpen No. 4-28084 discloses a technology that establishes a test mode by elevating Vcc (power source voltage) at the time of a wafer test, decides the activation timing of the sense amplifier in such a fashion as to achieve the highest operation speed,on the basis of this test result, and sets permanently this timing by means of programmable elements such as fuses.

To utilize the technology described in this reference, however, the "test mode" must be established by elevating the power source voltage Vcc at the time of the test under the wafer state.

In other words, if semiconductor memory devices are assembled after they are confirmed to operate normally under the wafer state, they should certainly operate under such a wafer condition, but their operation is not always guaranteed under conditions other than the wafer condition. Therefore, the test under the wafer condition must be carried out under the condition where read-out of the data of the memory cell to the bit lines gets most retarded in comparison with the sense amplifier activation signal. When the read-out test is carried out under the condition where power source voltage dependence of the speed of the read data signal to the bit lines, that is determined by the memory cell current, and power source voltage dependence of the speed of a latch timing generation circuit of the sense amplifier are different (as is usually the case), for example, the semiconductor memory device is judged as operating normally at a certain power source voltage but is not judged as operating normally at another certain power source voltage. To avoid such a problem, the power source voltage must be freely set and controlled by external signals at the time of the test so that the read condition during the test under the wafer condition becomes the worst within the operation guarantee range.

The result of the examination made by the present inventor has revealed that it is not so easy to satisfy the condition, under which the memory cell read operation becomes the worst as described above, in the prior art example described in Japanese Patent Laid-Open No. 4-28084 because the potential of the power source voltage Vcc must be set to a high level beyond the normal operable range in the "test mode" under the wafer condition. After all, the sense amplifier activation timing must be set with a margin of a certain degree, and the highest memory access time the circuit can reach cannot be accomplished easily. Besides the prior art reference described above, mention can be made of Japanese Patent Laid-Open Nos. 7-21776 and 11-3593 that render adjustable the operation timing of the sense amplifier by the use of the set values of fuses and resisters.

These references do not describe the adjustment of the fall timing of the word line or the adjustment of the recovery operation time on the basis of the test result.

SUMMARY OF THE INVENTION

To reduce the memory cell access time and the cycle time in the semiconductor memory, it is effective to improve the operation speed of the sense amplifier for amplifying the read signal from the memory cell, for example. A latch type sense amplifier for amplifying a signal of a small amplitude by positive feedback is one of the high-speed sense amplifiers. To exploit fully high-speed performance of this latch type sense amplifier, it is extremely important to generate appropriately a latch activation signal.

FIG. 2 shows an example of the latch type sense amplification circuit the present inventor has examined. If the latch activation signal SALAT is too quick in this circuit, the latch activation signal is generated before the correct data is outputted from the memory cell. In other words, the previous data of the selected memory cell is outputted erroneously. However, if the latch activation signal SALAT is retarded unnecessarily to avoid this erroneous operation, the delay time of the sense amplifier increases.

This problem results after all in the problem how to establish timing between the data read out from the memory cell and the latch activation signal of the sense amplifier. In the conventional semiconductor memories, efforts have been necessary for timing the latch activation signal with the optimal sense latch time determined by the read current of the selected memory cell by constituting the delay circuit by using the same circuit as the circuit, through which the memory cell selection signal passes, and generating the latch activation signal.

However, it is difficult to precisely establishing the timing between the read timing of the memory cell and the timing of the latch activation signal unless characteristics of devices such as MOS transistors are clarified at the time of design. If the actual characteristics of the device are different from the characteristics of the device assumed at the time of design, this difference creates the deviation between the optimal read timing of the memory cell and the latch activation timing. So long as the read path of the memory cell and the delay time path of latch activation cannot be constituted into exactly the same circuit, the times of these paths cannot be made equal to each other. It is therefore necessary to set the latch timing with a margin for the time that is anticipated design-wise, and the problem remains unsolved that the highest memory access time, that the circuit can originally reach, cannot be acquired.

The result of the experiments carried out by the present inventors has revealed that power source voltage dependence of the latch timing of the sense amplifier is greater than that of the data output timing of the memory cell. In other words, the lower the power source voltage, the smaller becomes the margin of the latching timing of the sense amplifier. It is therefore easier to insure the normal operation of the memories over the entire power source voltage range necessary for insuring the normal operation when the test under the wafer state is carried out while the power source voltage is set to a value below the lower limit value of the operation guarantee voltage.

According to the studies of the present inventors, the problems to be solved for improving the speed of the cycle time are as follows.

The first factor that affects the minimum cycle time capable of operating the memory is the time in which the word line rises, that is, the fall timing of the word line. When the memory shifts a certain read operation to a next read operation, the next read operation is sometimes retarded due to the data of the previous read operation unless the bit line opened by the first read operation is completely returned to the initial state. Therefore, the recovery operation must be conducted immediately after, or immediately before, the read operation so that the bit line can be returned to the initial condition. In other words, the two operations, that is, the read operation due to the rise of the word line and the recovery operation of the bit line, must be completed within one cycle. This means that the sum of the time in which the word line is active and the time necessary for the recovery operation governs the minimum cycle time that the memory can reach.

To shorten the cycle time, therefore, it is effective to reduce the time in which the word line rises to the minimum necessary time and to speed up the recovery operation and to shorten it. To this end, it is effective to correctly anticipate the time necessary for keeping the word line active and to set the time in which the word line is active, at the time of design. However, same as the problem concerning the timing of the sense amplifier activation, unless the characteristics of the MOS devices are clarified in detail, it is difficult to anticipate and design correctly this time, and the operation margin must be secured between the actual anticipation value and the design value. The design with such a margin involves the problem that the highest performance that the circuit can ultimately reach cannot be exploited.

It is therefore an object of the present invention to provide a semiconductor memory that can reduce the memory access time and can operate at a higher speed.

It is another object of the present invention to provide a semiconductor memory that can shorten the cycle time and can operate at a higher speed.

It is still another object of the present invention to make it possible to achieve a higher operation speed of both read cycle and write cycle in a semiconductor memory capable of reading and writing data by separately optimizing the cycle time of each of the data read and write operations.

The above and other objects and novel features of the present invention will be come more apparent from tile following description of the specification together with the accompanying drawings.

The following will represent the summary of typical inventions among the inventions disclosed in this application.

According to the conventional system that decides the delay route in the design stage, the difference of the delay time occurs unavoidably due to the difference between the anticipated device characteristics in the design stage and the actual device characteristics. Therefore, the present invention includes setting means (such as a fuse circuit) that regulates the timings of various signals inside the chip such as the activation timing of the sense amplifier, the fall timing of the word line, the recovery operation (equalization) timing of the bit line and the sense amplifier, and so forth, in the test stage of the chip after the actual chip is completed, and then programs (fixes) permanently the timings of the internal signals to the condition of the highest operation speed that can be confirmed as achievable in the check stage. Here, the term "recovery operation" of the bit lines, the sense amplifier, etc, means that the amplitude of the signal lines, that is expanded by a certain read operation, is quickly reduced by the equalization circuit so as to prepare for a next read operation.

In the present invention, therefore, the whether or not the chip operates normally is confirmed while the timings of the signals are changed after the chip is completed. The timings of the signals inside the chip are fixed to the condition of the highest operation speed that is confirmed as operating, and the chip can be set to the limit normal condition under which the highest performance can be obtained.

The operation guarantee range must be taken into consideration when the memory chip is tested. If the memory chip is confirmed as operating normally under the condition worse than the worst condition among the environmental conditions to guarantee the operation, it becomes possible to confirm that the memory chip operates normally within the full operation guarantee range.

The present invention includes variable check means for regulating the activation timing of the sense amplifier, the fall timing of the word line, the recovery operation (equalization) of the bit line and the sense amplifier, etc, in the test stage of the chip after the actual chip is completed, and checks the operation of the memory chip. Therefore, the present invention can cope with the difference of the anticipated device characteristic values at the time of design from the actual device characteristic values, and can exploit the performance suitable for the device.

The methods for regulating the internal timings in the chip operation test under the wafer state include the method that provides excessive signal input pads, that are not used in the final product, to the chip, and applies a DC voltage to these pads from a tester, the method that stores the regulation information of the timings into a plurality of internal registers from serial input terminals as stipulated by the JTAG (Joint Test Action Group) standard, and so forth. When these methods are employed, the normal operation condition, under which only the timings of the internal signals are changed, can be created without conducting the test by the method that affects the normal operation of the chip, such as the conventional method that changes the power source voltage. Therefore, the test can be conducted by freely changing the operation condition of the power source voltage, and so forth, so that the condition becomes the worst within the operation guarantee range, and the optimum timing of the internal signals can be determined.

In the present invention, the timings of the internal signals of the memory as the regulation object may be as follows.

(1) activation timing of sense amplifier,
(2) non-selection timing of word line,
(3) non-selection timing of Y system selection signals such as column switch,
(4) equalization start timing of bit line, sense amplifier, data bus of post-stage of sense amplifier, etc,
(5) equalization finish timing of bit line, sense amplifier, data bus of post-stage of sense amplifier, etc,
(6) timings (4) and (5) after write and read operations,
(7) set-up and hold time of input circuit in synchronous memory,
(8) clock timing of output latch in synchronous memory. When all, or a part, of these timings is rendered variable, the memory cell access time and the cycle time can be shortened with the result of the high operation speed of the memory.

These timings include the case where their effects can be inspected under the wafer state and the case where the effects cannot be inspected directly under the wafer state. The timings (2) to (4) among them, for example, have the effect of shortening the cycle time, but the internal clock needs not necessarily operate in the high-speed cycle in the inspection stage.

A large parasitic element such as an inductance or an electrostatic capacity couples with the input/output terminals during the inspection under the wafer state. Therefore, it is substantially difficult to operate the chip in the high-speed cycle and to measure correctly the timings among a plurality of input/output signals. An LSI chip. containing a memory is generally used after it is assembled into a package. Since the parasitic capacitance of the package and the parasitic capacitance during the inspection under the wafer state are naturally different from each other, it is generally not possible to estimate the measurement result after the assembly into the practical package from the measurement result under the water state.

When the AC characteristics directly associated with the input/output of the chip, i.e. specs such as the set-up time of the data signal with respect to the clock signal and the hold time, or the operation clock of the memory, is inputted from outside the chip, it is not realistic by the existing technologies to elevate the frequency beyond hundreds of MHz.

However, a so-called "built-in type memory" assembled into a microcomputer that multiplies the clock signal inputted from outside by an internal PLL circuit and supplies the signal so multiplied, is free from the limitation described above, and the full speed test can be conducted in some cases from the test stage. In this case, the minimum value of the cycle time can be tested naturally under the wafer state. The present invention does not exclude such a case, and is characterized by including means for controlling the timing of the internal signals in the test stage and means capable of setting the timings to those decided on the basis of the test result.

BRIEF DESCRIPTION OF THE DRAWINGS

FIGS. 6A and 6B are explanatory layout diagrams showing an arrangement example of a variable delay circuit in a circuit for regulating the timing in the clock synchronization type static RAM to which the present invention is applied;

DESCRIPTION OF THE PREFERRED EMBODIMENTS

Hereinafter, preferred embodiments of the present invention will be explained with reference to the accompanying drawings.

Figure 1:
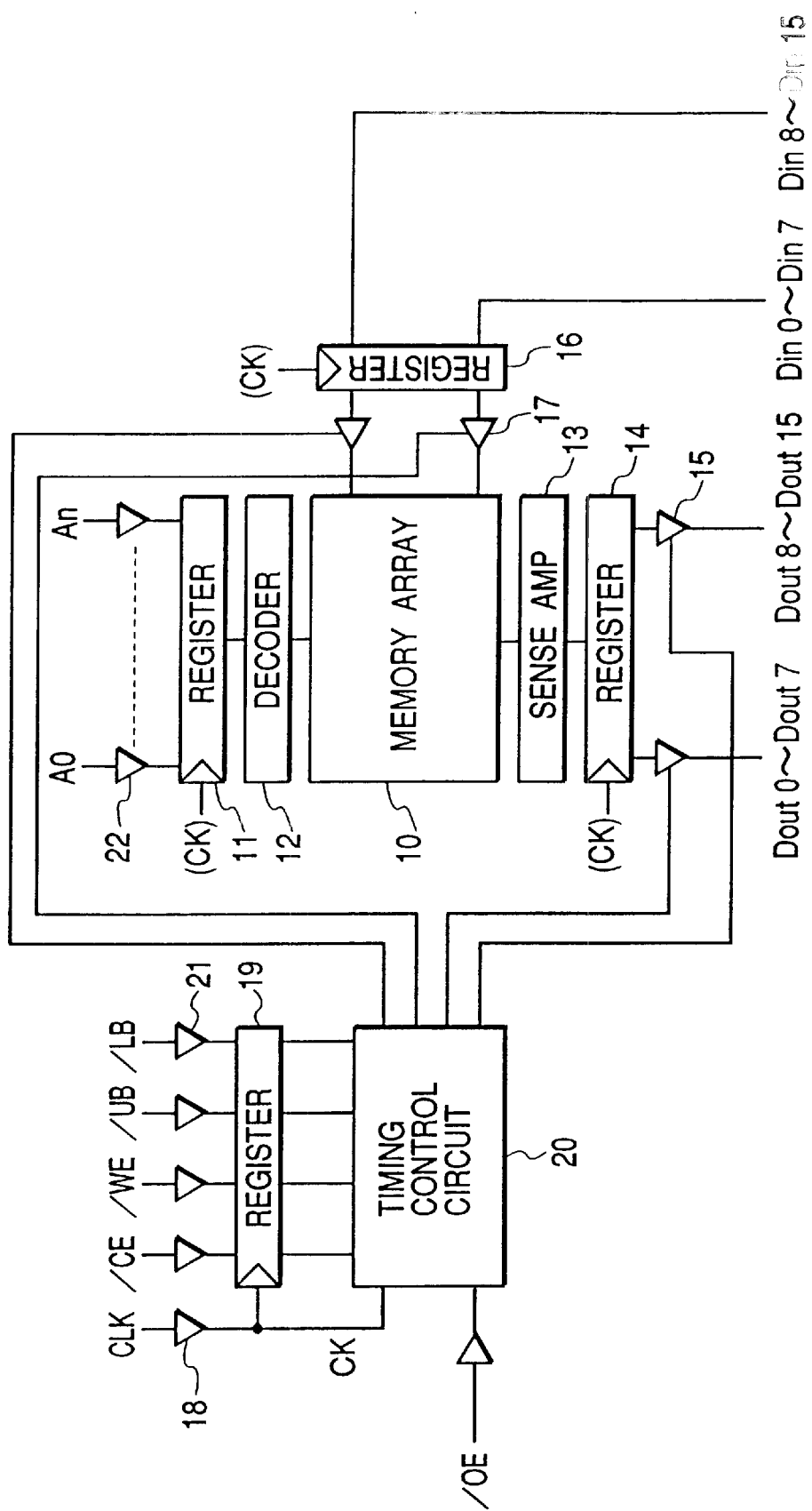
FIG. 1 is a block diagram showing an example of a clock synchronization type static RAM to which the present invention can be applied appropriately.

FIG. 1 is a schematic structural view showing a clock synchronization type static RAM to which the first embodiment of the present invention is applied appropriately.

Referring to FIG. 1, reference numeral 10 denotes a memory array that has a plurality of memory cells disposed in matrix, a plurality of word lines to which selection terminals of the memory cells of the same row are connected, and a plurality of bit lines to which input/output terminals of the memory cells of the same column are connected. Reference numeral 11 denotes an address register for latching input address signals A0 to An in synchronism with a clock signal CK. Reference numeral 12 denotes an address decoder for decoding the latched address signal and selecting the corresponding word line inside the memory array 10. Reference numeral 13 denotes a sense amplifier line comprising a plurality of sense amplification circuits each being disposed for each bit line pair to which the selected memory cell is connected, and for amplifying a potential difference of the bit lines. Reference numeral 14 denotes an output register for latching the read data that is amplified by the sense amplification circuit. Reference numeral 15 denotes a data output buffer for outputting the read data latched by the output register 14 to the outside of the chip.

In FIG. 1, reference numeral 16 denotes an input register for latching the input write data in synchronism with an internal clock signal CK. Reference numeral 17 denotes a write buffer for supplying the latched data to the memory array 10. Reference numeral 18 denotes a clock buffer for receiving a synchronous clock signal CLK supplied from outside, generating the internal clock signal CK and supplying it to predetermined internal circuits such as registers. Reference numeral 19 denotes a control register for latching a chip enable signal /CE as a chip selection signal supplied from outside, a write enable signal /WE as a write control signal, and a byte selection signal /UB, /LB for designating upper or lower order 8 bits of read/write data in synchronism with the internal clock signal CK. Reference numeral 20 denotes a timing control signal for giving a predetermined timing signal for the internal circuit to the data output buffer 15, the write buffer 17, etc, on the basis of the control signal latched by the. control register 18 and an out enable signal /OE as an output control signal inputted from outside. Reference numeral 21 denotes an input buffer for receiving the above-mentioned various control signals /CE, /WE, /UB and /LB inputted from outside. Reference numeral 22 denotes an address input buffer for receiving address signals A0 to An inputted from outside.

Though FIG. 1 shows the embodiment that has separately the terminal for outputting the read data and the terminal for inputting the write data, a construction that can output and input the read data and the write data, respectively, from a common terminal can be employed, too.

Figure 2:
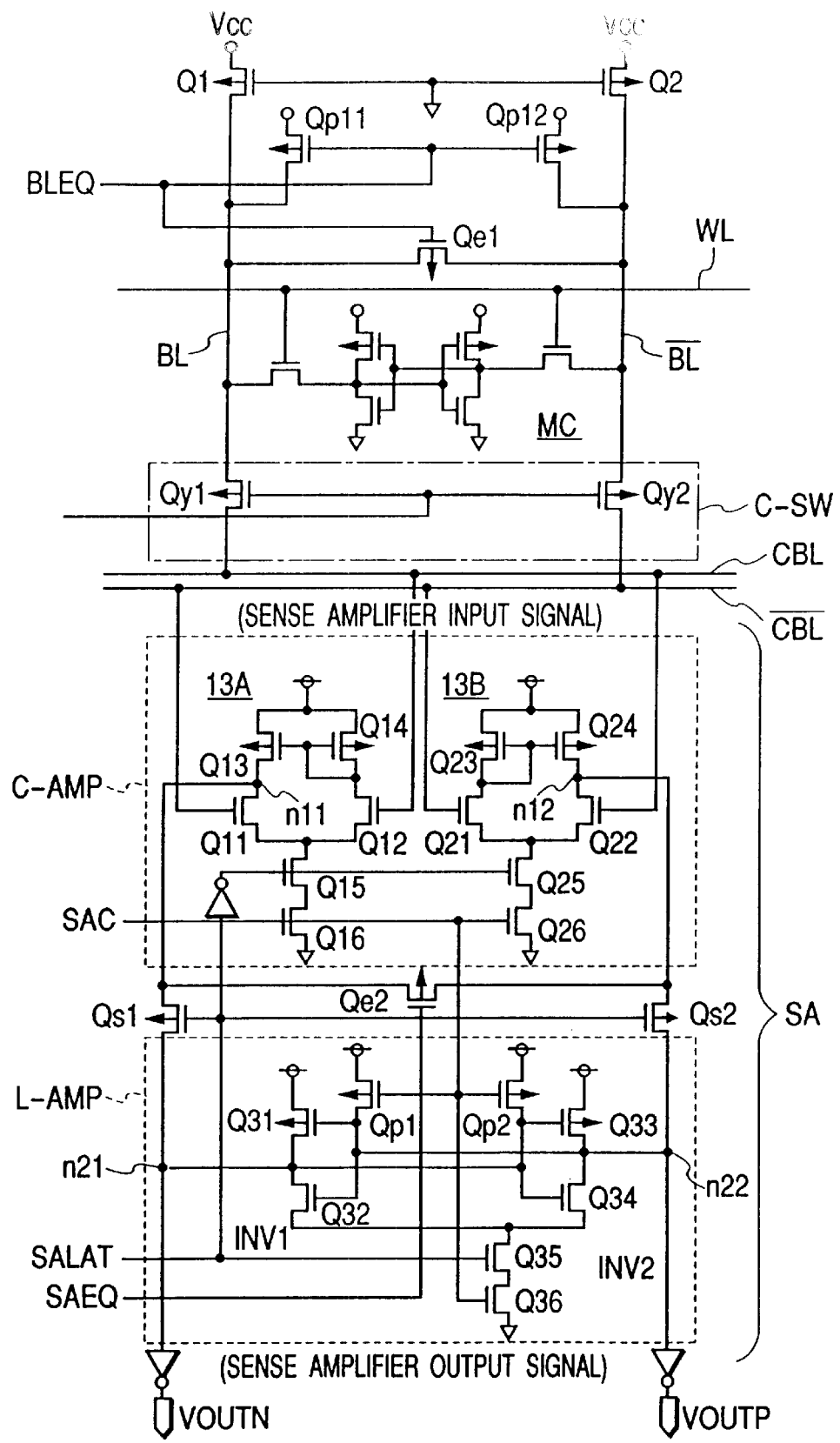
FIG. 2 is a circuit diagram showing an example of a sense amplification circuit according to the present invention.

FIG. 2 shows an example of the sense amplification circuit SA that is connected to a pair of bit lines BL and /BL inside the memory array through a column switch C-SW. Incidentally, FIG. 2 shows typically one of a plurality of memory cells MC of the same column each data input/output terminal of which is connected to the bit line BL, /BL and each selection terminal of which is connected to the corresponding word line WL. Symbols Q1 and Q2 represents load MOSFET that are connected between the bit line BL, /BL and the power source voltage terminal Vcc. Symbols Qp11 and Qp12 represent pre-charge MOSFET for pre-charging the bit line BL, /BL to the Vcc level before readout. Symbol Qe1 represents an equalization MOSFET for equalizing the bit lines BL, /BL to the same potential. These MOSFET, Op11, Qp12 and Qe11 are subjected to ON/OFF control simultaneously by the control signal BLEQ. The bit lines BL, /BL are connected to the common bit lines CBL, /CBL through the column switch C-SW. MOSFET Qy1 and Qy2 that together constitute the column switch C-SW are subjected simultaneously to ON/OFF control by a decode signal Yi from a column system address decoder.

The sense amplification circuit SA comprises a current mirror type amplification portion C-AMP whose input nodes n1 and n2 are connected to the common bit lines CBL and /CBL, and a latch type amplification portion L-AMP connected to the output nodes n11 and n12 of the current mirror type amplification portion C-AMP through switch MOSFET Qs1 and Qs2. An equalization MOSFET Qe2 is interposed between the output nodes n11 and n12 of the current mirror type amplification portion. The equalization MOSFET is subjected to ON/OFF control by an equalization signal SAEQ and so functions as to equalize the potentials of the node n11 and n12.

The current mirror type amplification portion C-AMP comprises two differential amplification portions 13A and 13B that are disposed in parallel. One of the common bit lines CBL is connected to the gate terminals of the respective differential input MOSFET Q11 and Q21, and the other common bit line /CBL is connected to the gate terminals of the differential input MOSFET Q12 and Q22 that form pairs with Q11 and Q12, respectively. Load MOSFET Q13, Q14 and Q23 Q24 of the differential amplification circuits 13A and 13B are connected in the current mirror connection, respectively.

In the differential amplification circuit 13A, the gate and the drain of the load MOSFET Q14 are connected. The drain terminal of Q13 is connected to the output node n11. In the differential amplification circuit 13B, the gate and the drain of the load MOSFET Q23 are connected to each other, and the drain terminal of Q24 is connected to the output node n12. In this way, the current mirror type amplification portion C-AMP comprises two differential amplification circuits 13A and 13B disposed in parallel, and in each differential amplification circuit 13A, 13B, the drain terminal of the MOSFET Q13, Q14 on the side not connected to the common drain of the load MOSFET is connected to the output node n11, n12 to constitute completely symmetric circuits. In consequence, these output nodes n11 and n12 are prevented from getting easily unbalanced from each other.

Furthermore, the series circuit of MOSFET Q15 and Q16 and the series circuit of Q25 and Q26 are interposed between the common source terminal of the differential MOSFET Q11 and Q12 the differential amplification circuits 13A and 13B and the earth point and between the common source terminal of Q21 and Q22 and the earth point, respectively. A signal obtained by inversing the selection activation control signal SALAT by an inverter is applied to the gate terminals of MOSFET Q15 and Q25, and a control signal SAC of the entire sense amplifier is applied to the gate terminals of MOSFET Q16 and Q26.

On the other hand, the latch type L-AMP comprises a positive feedback type latch circuit formed by cross-connecting the input terminals and the output terminals of two CMOS inverters INV1 and INV2, pre-charge MOSFET Qp1 and Qp2 connected between the input terminals of these inverters and the power source voltage, respectively, and a series circuit of MOSFET Q35 and Q36 between the N-MOS sides of the CMOS inverters INV1 and INV2 and the earth point. The selection activation control signal SALAT is applied to the gate terminal of MOSFET Q35, and the control signal SAC of the entire sense amplifier is applied to the gate terminals of MOSFET Q36 and Qp1 and Qp2. Furthermore, the control signal SALAT is applied to the gate terminals of MOSFET Qs1 and Qs2.

Therefore, when MOSFET Q35 is turned ON by the control signal SALAT and the latch type amplification portion L-AMP is activated, MOSFET Qs1 and Qs2 are turned OFF and are cut off from the differential amplification circuit 13A and 13B while MOSFET Q15 and Q25 are turned OFF and the differential amplification circuits 13A and 13B become inoperative. When MOSFET Q15 and Q25 are turned ON by the control signal SALAT and the differential amplification circuits 13A and 13B are activated, MOSFET Q35 is turned OFF and the latch type amplification portion L-AMP becomes inoperative. In this instance, MOSFET Qs1 and Qs2 are turned ON and the amplification outputs of the differential amplification circuits 13A and 13B are transferred to the latch type amplification portion L-AMP. Furthermore, either one of the differential amplification circuit 13A, 13B and the latch type amplification portion L-AMP becomes essentially operative if the control signal SALAT is applied alone. Therefore, MOSFET Q16, Q26 and Q36 are turned OFF by the control signal SALAT to restrict consumed power.

Figure 3:
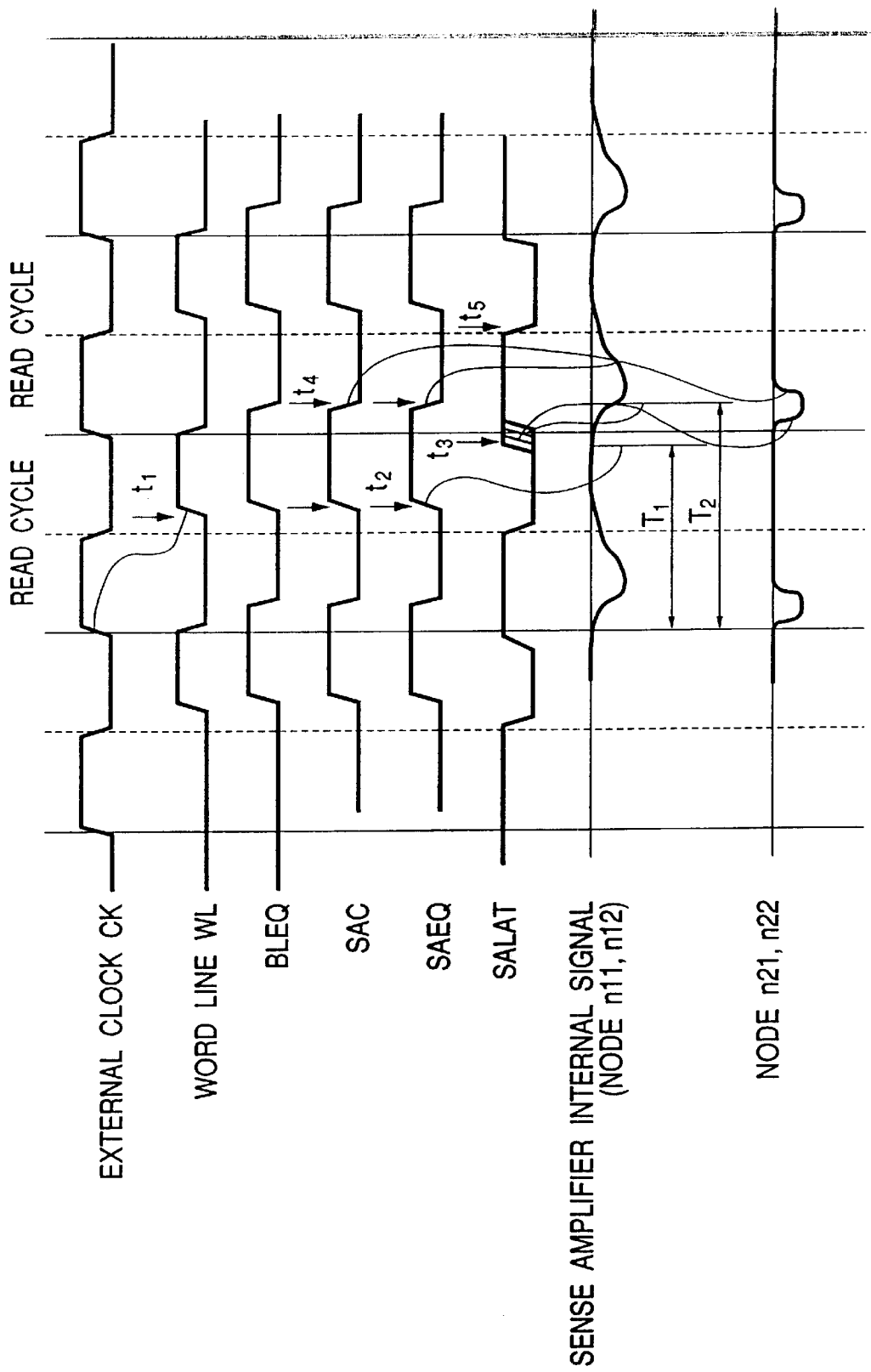
FIG. 3 is a time chart showing the change of signals in a data read operation in a synchronous SRAM according to an embodiment of the present invention.

Next, the operation of the sense amplification circuit of this embodiment will be explained with reference to the time chart shown in FIG. 3.

In the read operation of the memory cell, the equalization control signal BLEQ of the bit line changes to the high level at the rise timing (t1) of the potential of the selected word line WL by the selection of the word line, the equalization MOSFET Qe1 is turned OFF, and the potentials of the bit lines BL and /BL start expanding. The control signal SACM of the current mirror type amplifier is changed to the high level as shown in FIG. 3(B) in match with this timing t1 so that MOSFET Q16 and Q26 are turned ON. As the control signal SALAT of the latch type amplifier remains at the low level, MOSFET Q15 and Q25 are turned ON and two differential amplification circuits 13A and 13B are activated. However, even when the differential amplification circuits 13A and 13B are activated, the equalization control signal SAEQ remains at the low level for a while lest the equalization MOSFET Qe2 is turned OFF immediately.

Consequently, the differential outputs of the current mirror type amplifier C-AMP starts falling towards the operating point while keeping substantially the same potential with each other. The equalization control signal SAEQ is changed to the high level in match with the point of time (timing t2) at which the differential outputs of the current mirror type amplifier C-AMP reach the operating points, and the equalization MOSFET Qe2 is turned OFF. In this way, the differential amplification circuits 13A and 13B amplifies the common bit lines CBL and /CBL.

The control signal SALAT of the latch type amplifier is thereafter changed to the high level at the point of time (timing t3) at which the differential outputs of the current mirror type amplifier C-AMP expand to a certain extent. Then, the MOSFET Q36 in the latch type amplifier L-AMP is turned ON and the switch MOSFET Qs1 and Qs2 between the current mirror type amplifier C-AMP and the latch type amplifier L-AMP are turned ON. As the control signal SAC exists at the high level at this time, the MOSFET Q35 is turned ON while the pre-charge MOSFET Qp1 and Op2 are turned OFF. The latch type amplifier L-AMP is therefore activated, and the potential of the internal nodes n21 and n22 of the sense amplifier (the outputs of the current mirror type amplifier C-AMP) is amplified further by the latch type amplifier L-AMP.

The control signal SAC is changed thereafter to the low level. In consequence, the MOSFET Q36 of the latch type amplifier L-AMP is turned OFF, the pre-charge MOSFET Qp1 and Op2 are turned ON, and pre-charge of the input terminal of the latch type amplifier L-AMP is started (timing t4). At the same time, the equalization control signal SAEQ is changed to the low level and the equalization MOSFET Qe2 between the output nodes n11 and n12 of the current mirror type amplifier C-AMP is turned ON so as to start the recovery operation by equalization. As the control signal SALAT changes thereafter to the low level, the MOSFET Qs1 and Qs2 are turned ON and the output nodes n11 and n12 of the current mirror type amplifier C-AMP are connected to the input/output nodes of the latch type amplifier L-AMP (timing t5).

As described above, the sense amplification circuit of this embodiment comprises the current mirror type amplifier C-AMP and the latch type amplifier L-AMP as the next stage circuit of the former. The current mirror type amplifier first amplifies the potential difference of the bit lines and then the latch type amplifier of the next stage amplifies further the potential difference. Since the current mirror type amplifier having a smaller input offset voltage than the latch type amplifier thus receives the potential difference of the bit lines, the unbalance of the output resulting from the process variance can be reduced, and the sense amplification circuit can provide the operation characteristics that are more stable than the sense amplification circuit comprising only the latch type amplifiers.

In addition, after the latch type amplifier L-AMP is activated by the signal SALAT that controls the operation of the latch type amplifier, the operation of the current mirror type amplifier C-JMP is stopped. In this way, it is possible to shorten the period in which the current mirror type amplifier having great power consumption operates and to reduce overall consumed power of the sense amplification circuit. Because both of the differential amplification circuits 13A, 13B and the latch type amplification portion L-AMP can be rendered inoperative by the control signal SAC, consumed power can be further reduced.

The sense amplification circuit SA amplifies and latches the data, that are amplified by the latch type. amplifier L-AMP, by the rise of the signal SALAT for controlling the operation of this sense amplification circuit. Therefore, the quicker this timing, the shorter the memory access time can be made. If the rise timing of the control signal SALAT is too quick, however, the previous data is likely to be latched before it is fully inversed. For this reason, this embodiment is constituted in such a fashion that the timing of the latch operation of the latch type amplifier L-AMP can be changed when the rise timing of the control signal SAMAT is changed. By the way, symbol T1 in FIG. 3 represents the time required for the correct read data to reach the input of the latch type amplifier L-AMP, and T2 represents the time required for the latch type amplifier L-AMP to latch the data.

Figure 4:
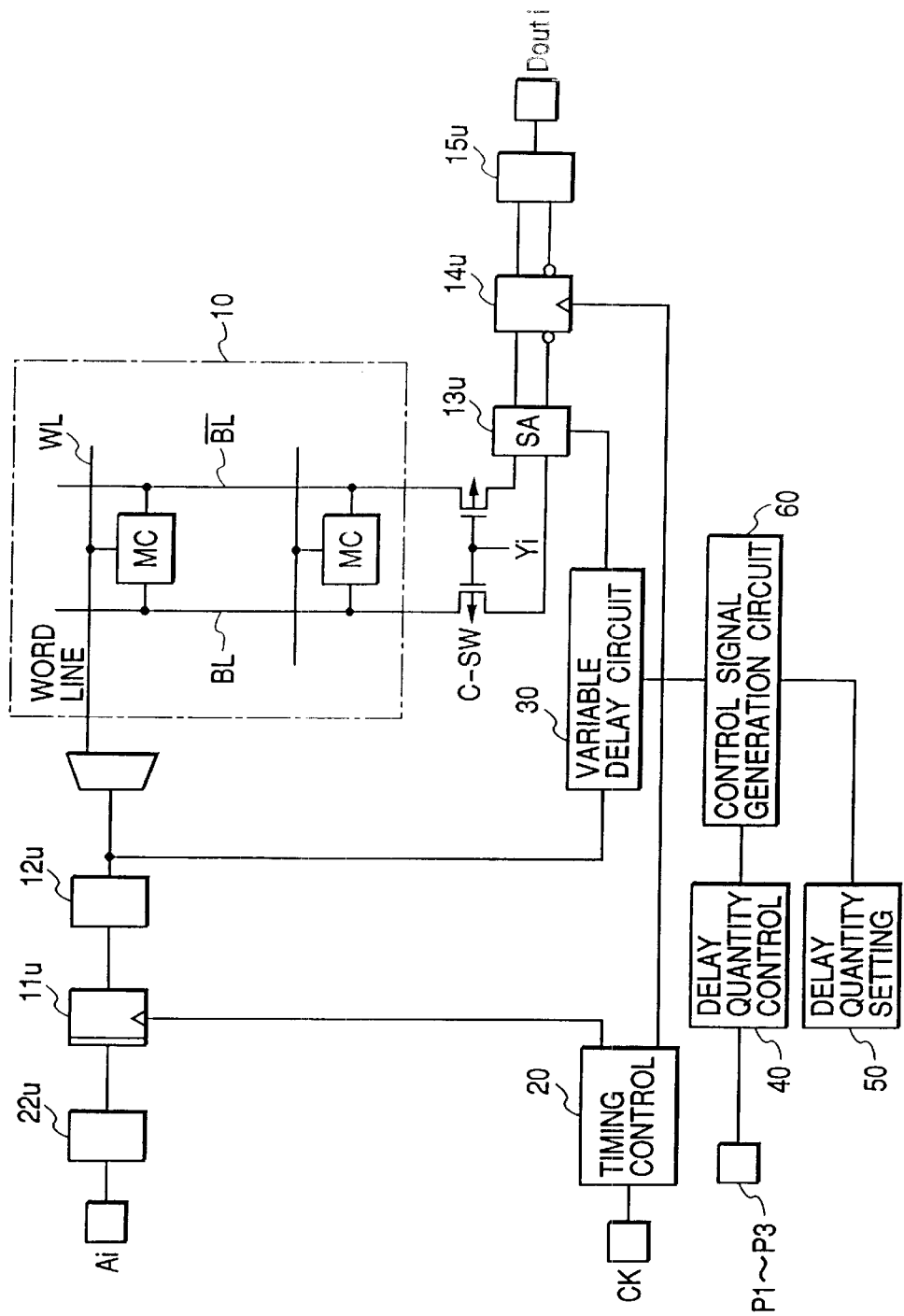
FIG. 4 is a block diagram showing a schematic structural example of the clock synchronization type static RAM to which the present invention is applied.
Figure 5:
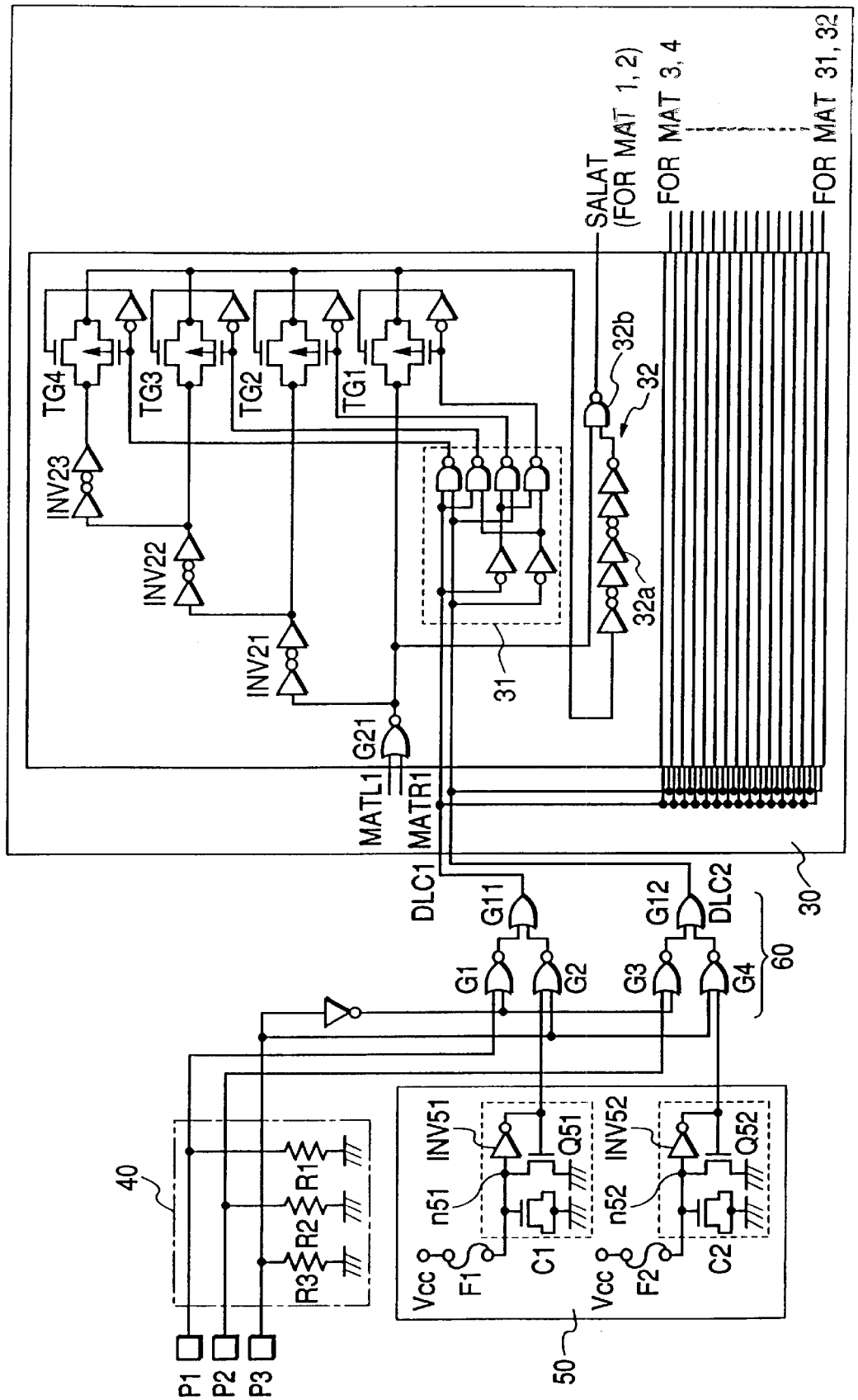
FIG. 5 is a structural circuit diagram showing a concrete example of a circuit for regulating the timing in the clock synchronization type static RAM to which the present invention is applied.

FIG. 4 is a block diagram showing an embodiment of a memory so constituted as to be capable of changing the rise timing of the signal SALAT described above. FIG. 5 shows concrete examples of a variable delay circuit for changing the signal timing and a program circuit for setting the variable delay circuit. Incidentally, in FIG. 4 the common block represented by the common reference numeral as in FIG. 1 represents the circuit corresponding to one bit or to the unit of each circuit block shown in FIG. 1.

In this embodiment, the signal SALAT for controlling the operation of the sense amplifier 13u (SA) is generated on the basis of the output signal of the pre-decoder 12u and the variable delay circuit 30 is interposed between the pre-decoder 12u and the sense amplifier 13u (SA) as shown in FIG. 4, though this circuit arrangement is not restrictive, in particular. This embodiment includes further delay quantity controlling means 40 for giving a signal for controlling the delay quantity in the variable delay circuit 30 during the test operation, delay quantity setting means 50 for giving a signal for setting the delay quantity in the variable delay circuit 30 on the basis of the test result, and a control signal generation circuit 60 for generating the control signal for the variable delay circuit 30 on the basis of the output of the delay quantity controlling means 40 and the output of the delay quantity setting means 50.

The delay quantity controlling means 40 comprises, for example, high resistance pull-down resistors R1, R2 and R3 connected to test terminals P1, P2 and P3 as shown in FIG. 5. The test terminals P1 to P3 are formed as hidden pads that are not connected to external terminals (leads) under the sealed state to a package. The power source voltage Vcc or the earth potential is applied to these pads through a probe in the stage of probe inspection of the wafer final process, and the delay quantity in the variable delay circuit 30 is determined in accordance with the combination of the impressed voltages. Incidentally, one of the three voltages applied to the test terminals P1, P2 and P3 is used for rendering the signal of this delay quantity controlling means 40 effective or for rendering the output of the later-appearing delay quantity setting means 50 effective. In other words, the delay quantity in the variable delay circuit 30 is determined substantially by the two bits other than this voltage.

The delay quantity setting means 50 comprises, for example, fuse elements F1 and E2 each of which is connected at one of the ends thereof to the power source voltage Vcc, n channel MOSFET Q51 and Q52 that are connected in series with the fuse elements F1 and F2, respectively, between the power source voltage terminal and the earth point, inverters INV51 and INV52 the input terminals of which are connected to the junction nodes 51 and n52 between the fuse elements F1 and F2 and the MOSFET Q51 and Q52, respectively, and the outputs of which are fed back to the gate terminals of the MOSFET Q51 and Q52, respectively, and capacitance elements C1 and C2 using the gate capacitance of the MOSFET connected to the junction points between the nodes n51 and n52. The outputs of the inverters INV51 and INV52 are supplied as two-bit set signals to the control signal generation circuit 60 in accordance with the condition of the fuse elements F1 and F2 to form the control signal for the variable delay circuit. The delay quantity in the variable delay circuit 30 is determined in accordance with the combination of the set signals.

The explanation will be given more concretely. When the fuse elements F1 and F2 are cut off, the input of each inverter INV51, INV52 is brought to the ground potential and its output rises to the high level. This high-level output is supplied to the control signal generation circuit 60. At this time, the output of each inverter INV51, INV52 is fed back to the gate terminal of the corresponding MOSFET Q51, Q52, and the transistor Q51, Q52 is turned ON. Consequently, the node n51, n52 is fixed to the earth potential and is prevented from floating. On the other hand, when the fuse elements F1 and F2 are not cut off, the input of each inverter INV51, INV52 is pulled up to the power source voltage Vcc and its output is brought to the low level. Incidentally, a non-volatile memory device such as the one used for a flash memory may be used to generate the delay quantity setting signal in place of the fuse element.

Table 1 tabulates an example of the relationship among the impressed voltages to the pads P1 to P3 in the delay quantity controlling means 40, the condition of the fuse elements F1 and F2 in the delay quantity setting means 50 and the delay quantity in the variable delay circuit 30.

TABLE 1

| signal No. of inverter stages (delay time) | pad P3 | pad P2 | pad P1 | fuse F1 | fuse F2 |
|---|---|---|---|---|---|
| 2 (0.1 nS) | L | X | X | uncut | uncut |
| 6 (0.3 nS) | L | X | X | uncut | cut |
| 0 | L | X | X | cut | uncut |
| 4 (0.2 nS) | L | X | X | cut | cut |
| 2 (0.1 nS) | H | L | L | X | X |
| 6 (0.3 nS) | H | L | H | X | X |
| 0 | H | H | L | X | X |
| 4 (0.2 nS) | H | H | H | X | X |

In Table 1, symbol X represents irrelevance to the condition. As can be seen clearly from Table 1, this embodiment can changes the delay quantity in the delay quantity controlling means 40 by 0.1 mS in four stages. In other words, this embodiment can change the timing of the signal SAMAT for controlling the operation of the sense amplification circuit SA (or the data latch timing of the latch type amplifier L-AMP) in four stages. However, the number of fuses (the number of variable stages of the delay quantity) is not limited to 2 (four stages) but three (eight stages) or four (sixteen stages) may be employed, as well.

The control signal generation circuit in this embodiment comprises NOR gates G1 to G4 for inputting the signal from the delay quantity controlling means 40 and from the delay quantity setting means 50 on the basis of the impressed voltages to the pads P1 and P2, an OR gate circuit G11 for inputting the outputs of the NOR gates G1 and G2 among these gate circuits G1 to G4, and an OR gate G12 for inputting the outputs of the NOR gates G3 and G4 as shown in FIG. 5. This control signal generation circuit 60 generates the delay quantity control signals DLC1 and DLC2 to the variable delay circuit 30.

In this control signal generation circuit 60, the signal from the delay quantity controlling means 40 based on the impressed voltages to the pads P1 and P2 and the inversion signal from the delay quantity controlling means 40 based on the impressed voltage to the pad P3 are applied to the NOR gates G1 and G3, and two signals from the delay quantity setting means 50 and the signal from the delay quantity controlling means 40 on the basis of the impressed voltage to the pad P3 are inputted to the NOR gates G2 and G4.

In consequence, as tabulated in Table 1, the signal from the delay quantity setting means 50 is rendered effective when the impressed voltage to the pad P3 is at the low level, and the delay quantity setting signals DLC1 and DLC2 are generated in accordance with the condition of the fuse elements F1 and F2. When the impressed voltage to the pad P3 is at the high level, on the other hand, the signal from the delay quantity controlling means 40 on the basis of the impressed voltages to the pads P1 and P2 are rendered effective, and the delay quantity control signals DLC1 and DLC2 are generated in accordance with the impressed voltages to the pads P1 and P2.

The variable delay circuit 30 comprises a NOR gate circuit G21 for inputting select signals MATL and MATR for selecting two adjacent memory mats inside the memory array 10, delay inverters INV21, INV22 and INV23 connected to the output side of the NOR gate circuit G21, transfer gates TG1, TG2, TG3 and TG4 connected to the output terminals of the NOR gate circuit G21 and the delay inverters INV21 to INV23, respectively, and a decoder circuit 31 for decoding the delay quantity control signals DLC1 and DLC2 from the control signal generation circuit 60 (the output signals of the OR gate circuits G11 and G12) and generating ON/OFF control signals of the transfer gates TG1 to TG4.

When any one of the transfer gates TG1 to TG4 is rendered conductive by the decoder circuit 31, either the output of the NOR gate G21 or the signal obtained by delaying this output by the delay inverters INV21 to INV23 is supplied as the signal SALAT for controlling the operation of the sense amplification circuit SA of the corresponding memory mat through a one-shot pulse generation circuit 32.

Consequently, the variable delay circuit 30 can regulate the rise timing of the control signal SALAT on the basis of the signals from the delay quantity controlling circuit 40 and from the delay quantity setting circuit 50. The one-shot pulse generation circuit 32 comprises an inverter train 32a and a NAND gate circuit 32b for inputting the signal passing through the inverter train 32a and the output of the NOR gate circuit G21, and generates and outputs a pulse having a pulse width corresponding to the delay time of the inverter train 32.

Incidentally, FIG. 5 shows concretely one of. the variable delay circuits for generating the signal SALAT for controlling the operation of the sense amplification circuit SA of the corresponding memory mat and regulating the rise timing of this signal on the basis of the signals MATL1 and MATR1 for selecting the two adjacent memory mats. In this embodiment, however, a similar variable delay circuit 30 is disposed also in the other memory mat.

The signal SALAT for controlling the operation of the sense amplification circuit SA of the corresponding memory mat is generated on the basis of the signals MATL and MATR for selecting the two adjacent memory mats in order to restrict the increase of the circuit scale in comparison with the case where the variable delay circuit is disposed for each mat. A plurality of variable delay circuit 30 are disposed dispersedly in the proximity of the memory mat in order to prevent the deviation of the signal delay time resulting from the difference of the positions of the mats, that is, the difference of the length of the signal lines as shown in FIG. 6B.

Figure 7A:
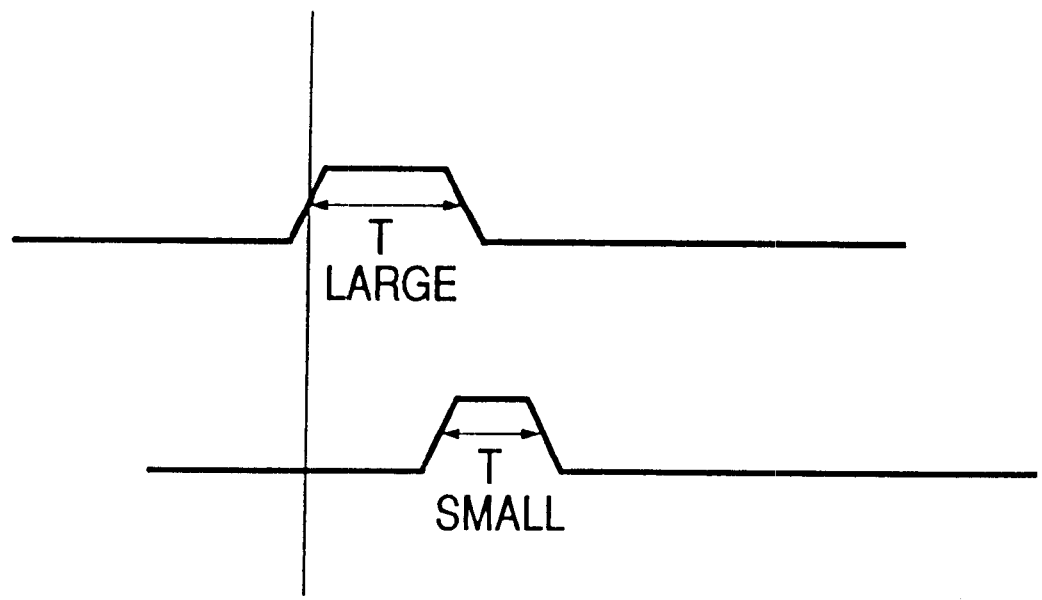
FIGS. 7A and 7B are explanatory layout diagrams showing the difference of timings of signals between the case where the arrangement example of a variable delay circuit is contrived and the case where it is not.
Figure 7B:
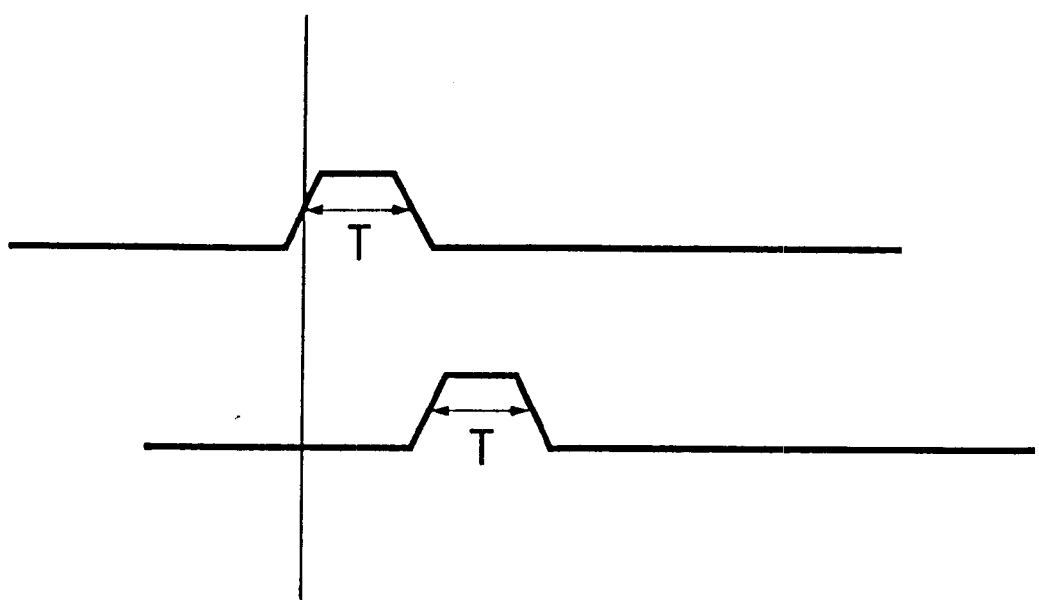

If the variable delay circuit 30 is disposed at one position inside the memory array as shown in FIG. 6A, variance of the distance from this variable delay circuit 30 to the sense amplification circuit SA to each memory cell, that is, the length of the signal lines, becomes extremely great with the result that variance of the pulse width of the signals becomes great, too, as shown in FIG. 7A. If the variable delay circuits 30 are dispersedly disposed in the proximity of the memory mats as shown in FIG. 6B, variance of the pulse width resulting from the difference of the mat positions, that is, the difference of the signal lines, can be prevented as shown in FIG. 7B. In this embodiment, moreover, the control of the variable delay circuit 30 is executed by the DC-like signals from the delay quantity controlling circuit 40 and the delay quantity setting circuit 50. Therefore, even when the distance of the control signal lines to the variable delay circuit 30 disposed inside the memory array 10 and their differences become great, the influences by the delay become smaller than when the timing is controlled by the AC-like control signal.

In this circuit, further, as shown in FIG. 6B, the supplying direction of the delay quantity controlling signals DLC1 and DLC2 from the control signal generation circuit 60 to a plurality of variable delay circuits 30 is set to Z2 with respect to the data outputting direction Z1 from the sense amplification circuit SA to the data register or to the output buffer so as to reduce the difference of the signal delay quantity depending on the paths. In other words, because the directions Z1 and Z2 are set in this way, the signal arrives more quickly at the variable delay circuit 30C in the proximity of the center of the memory mat than at the variable delay circuit 30E in the proximity of the memory mat at the end portion of the memory array, for example. Therefore, the difference occurs in the signal transmission as shown in FIG. 7B. As to the read data from the memory mat, however, the signal from the memory mat at the center has a greater delay quantity than the signal from the memory mat at the end portion. When the both delay quantities are summed, the sums are substantially equal to each other. As a result, the memory access time of the entire memory remains substantially equal irrespective of the memory mat positions.

This embodiment generates the control signal SALAT of the latch type amplifier L-AMP capable of varying the rise timing on the basis of the output signal of the pre-decoder 12u, but the control signal SALAT of the latch type amplifier L-AMP can be generated on the basis of the signals from other circuits.

This embodiment represents the case where the control signal SALAT of the latch type pre-amplifier L-AMP is rendered variable. As to the control signal SALAT, however, there is the case where the overall read speed can be improved depending on the circuit construction by keeping the pulse width constant and changing its rise timing and fall timing in the same way. In such a case, the circuit can be easily accomplished by merely changing the signal path so that the signals of the transfer gates TG1 to TG4 and these signals after passing through the inverter train 32a can be inputted to the one-shot pulse generation circuit 32 in place of the output signal of the NOR gate circuit G21 in FIG. 5.

Figure 8:
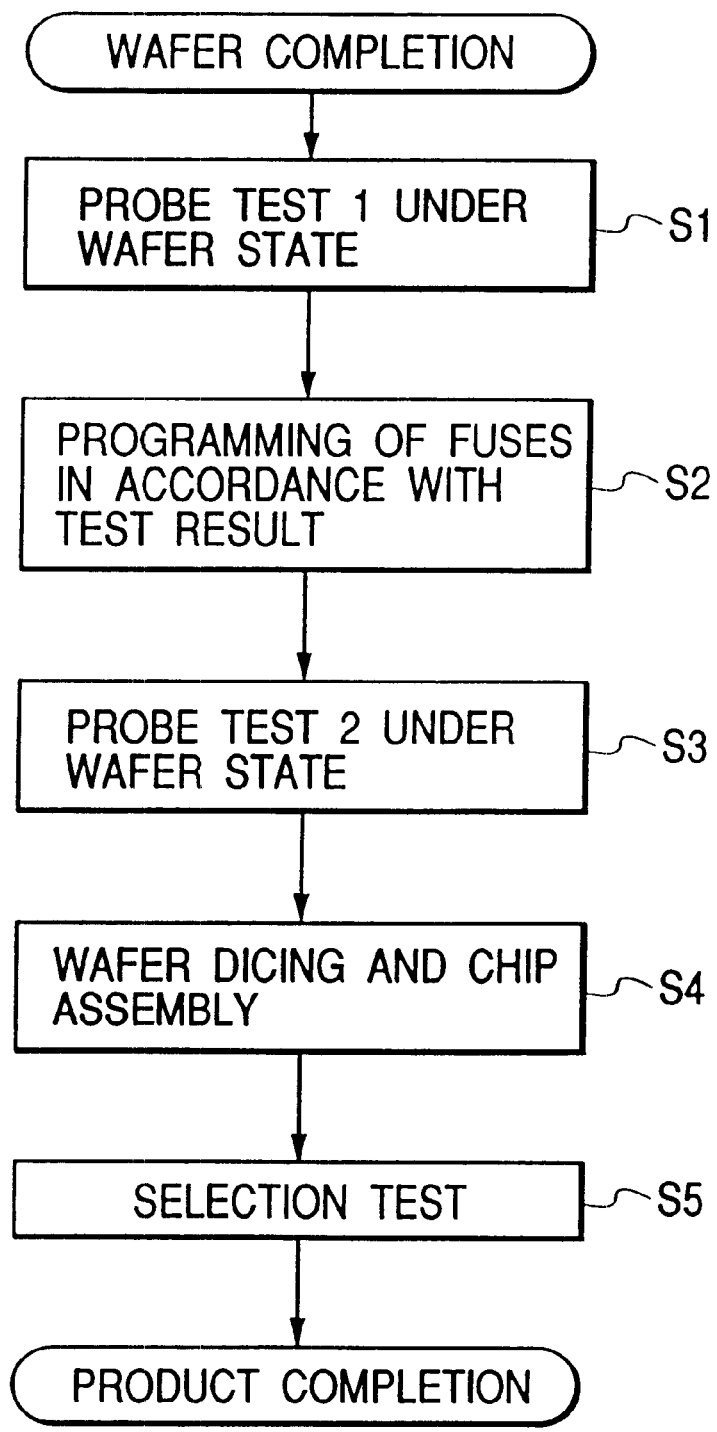
FIG. 8 is a flowchart showing the procedure from a production process, to a testing process and to completion of a product, in the synchronization type SRAM to which the present invention is applied.

Next, the procedures from the production process of the synchronous SRAM of this embodiment to its test and completion of the product will be explained with reference to the flowchart of FIG. 8.

When the wafer to which a plurality of memory chips having the construction of this embodiment are mounted is completed, the first probe test (Step S1) is executed under the wafer state to find out the worst timing (the timing at which the chip does not operate unless the rise timing of the control signal SALAT of the latch type amplifier L-AMP is delayed to the lowest limit) within the operation guarantee range. More concretely, the power source voltage applied to each chip is set to the lowest voltage within the operation guarantee range and the impressed voltage to the pad P3 of the delay quantity controlling circuit 40 is fixed at the high level. Under this condition, the combination of the impressed voltages to the pads P1 and P2 is changed to find out the quickest timing among the timings at which the correct read data can be obtained.

Next, the fuses F1 and F2 of the delay quantity setting circuit 50 are then processed so as to achieve this timing (Step S2). In other words, it will be assumed that when the impressed voltages to the pads P1 and P2, the condition of the fuses F1 and F2 and the delay time in the variable delay circuit 30 have the relationship tabulated in Table 1, for example, the quickest timing can be obtained if the delay time is set to 0.1 nS by setting the pads P1 and P2 to the low level, respectively. Then, the fuses F1 and F2 are set to the "uncut state". In this manner, the quickest memory cell access time, that this chip can attain, can be obtained. Incidentally, the pads P1 to P3 are fixed to the low level by the operation of the pull-down resistors R1 to R3 unless the probe applies the voltage to these pads P1 to P3 during the test. When the chip is thereafter sealed into the package, therefore, the pads P1 to P3 are at the low level, and the condition of Table 1 (that is, P3="L") can be satisfied.

It will be assumed, on the other hand, that the quickest timing is obtained when the delay time is set to 0.3 nS as the pad P1 is set to the low level and the pad P2 is set to the high level. In this case, the fuse F1 is set to the "uncut state" and the fuse F2, to the "cut state". Assuming further that the quickest timing can be obtained when the delay time is set to 0 as the pad P1 is set to the high level and the pad P2, to the low level. Then, the fuse F1 is set to the "cut state" and F2, to the "uncut state". Furthermore assuming that the quickest timing can be obtained when the delay time is set to 0.2 nS as the pads P1 and P2 are set to the high level, respectively. Then, both fuses F1 and F2 are set to the "cut state".

Thereafter, the second wafer test is carried out to inspect whether or not programming to the fuses is reliably conducted (Step S3). The wafer is then diced to cut out the chips. Only the approved chips are assembled into each package (Step S4). The assembled products are then subjected to the selection test by using an aging apparatus, etc, (Step S5), and the products are completed.

The explanation given above explains the embodiment of the memory in which the rise timing of the control signal SALAT of the latch type amplifier L-AMP is rendered variable for shortening the memory access time. To shorten the cycle time, too, the word line non-select time, that is, the fall timing of the word line, must be adjusted, too. However, the fall timing of the word line is generally governed by the read finish timing of the sense amplifier and cannot be set before the finish of this readout operation. Therefore, the adjustment for quickening the latch timing of the sense amplifier and the adjustment for quickening the non-select timing of the word line can be done in the interlocking arrangement with each other.

In other words, the delay signals obtained by the variable delay circuit 30 shown in FIG. 5 (the signal on the output side of the transfer gates TG1 to TG4, for example) may be supplied to the word driver so that the fall timing of the word line is interlocked with the latch timing of the sense amplifier. In this case, the margin from the latch timing of the sense amplifier to the non-select timing of the word line is fixed by design. However, fluctuation: of advance/delay of the latch timing due to the increase of the memory cell current changes automatically the non-select timing of the word line, and provides the merit that the adjustment of only one parameter can-accomplish shortening of the memory cell access time and shortening of the cycle time. Moreover, because the fall timing of the word line and the latch timing of the sense amplifier are interlocked with each other by using commonly the variable delay circuit 30 in this way, the circuit scale of the variable delay. circuit, the number of pads necessary for inputting at the time of the test, the number of fuses for setting the delay, and so forth, can be reduced. Eventually, the chip area as well as the cost of production can be reduced.

Next, another embodiment, wherein the fall timing of the word line is rendered variable independently of the latch timing of the latch type amplifier L-AMP to shorten the cycle time, will be explained with reference to FIGS. 9 and 10. In the embodiment shown in FIGS. 9 and 10, the rise timing of the control signal SALAT for the latch type amplifier L-AMP, too, is variable in the same way as in the first embodiment. The repetition of explanation on this point will be omitted, and only different portions will be explained.

Adjustment o the non-select timing of the word line or its select period is associated with recovery of the bit line. When the non-select timing of the word line is slow and its select period is long, the previous read data is outputted from the memory cell for a late timing, interferes with and retards the next read operation, or invites the erroneous operation of the next read operation. Therefore, the time in which the word line exists at the select level is preferably as short as possible. If the word line select period is too short, however, the correct data cannot be read or written.

That the select time of the word line governs the cycle time of the memory cell means that the condition occurs in which the memory fails to operate normally if the sum of the select time of the word line and the minimum necessary non-select time exceeds the cycle time. Therefore, it can be appreciated that when the select time of the word line is reduced to the minimum necessary time for the operation during the timing adjustment inside the memory, the cycle time obtained at this time is the minimum cycle time obtained from this memory. The embodiment shown in FIG. 9 shows the one that can adjust the select time of the word line.

Figure 9:
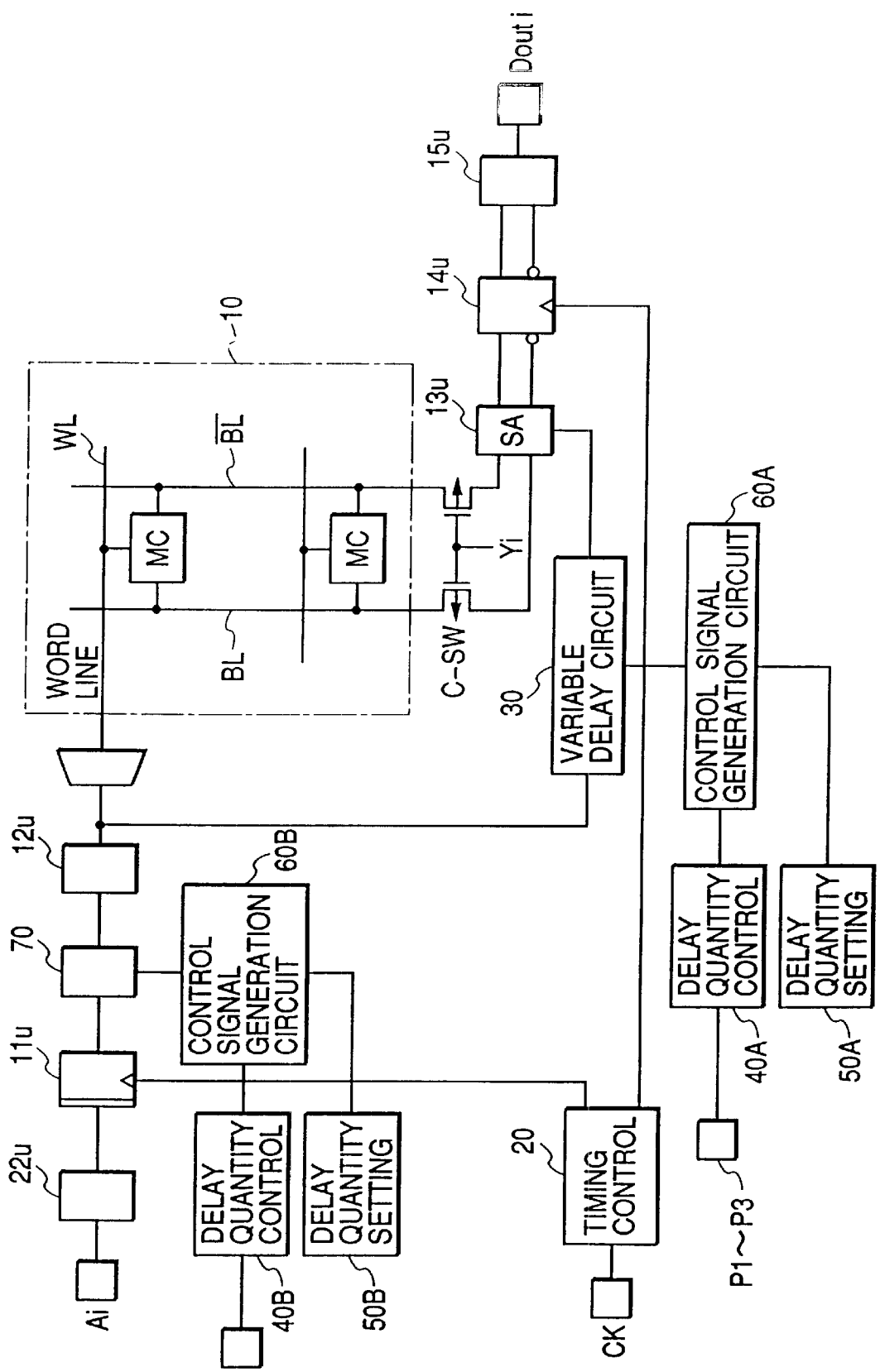
FIG. 9 is a block diagram showing a schematic structural example of a synchronous RAM of the second embodiment to which the present invention is applied.

In this second embodiment, the variable pulse generation circuit 70 is interposed between the address register 11u and the address pre-decoder 12u as shown in FIG. 9. The variable pulse generation circuit 70 renders the fall of the internal address signal supplied to the pre-decoder 12u. In this way, a signal having a variable pulse width is generated. In order to vary the pulse width in this variable pulse generation circuit 70 and to conduct the test of the memory, this embodiment includes a second delay quantity controlling circuit 40B, a second delay quantity setting circuit 50B for setting the delay quantity determined on the basis of the test result and a second control signal generation circuit 60B for generating a control signal for the variable pulse generation circuit 70.

The variable pulse generation circuit 70 is the one that has substantially the same circuit construction as the variable delay circuit 30 in the first embodiment shown in FIG. 5. The second delay quantity controlling circuit 40B, the second delay quantity setting circuit 50B and the second control signal generation circuit 60B have substantially the same circuit construction as those of the delay quantity controlling circuit 40, the delay quantity setting circuit 50 and the control signal generation circuit 60 of the first embodiment shown in FIG. 5, respectively.

In the second embodiment, too, the rise timing of the control signal SALAT of the latch type amplifier L-AMP is variable in the same way as in the first embodiment as described above. Therefore, the second embodiment includes the variable delay circuit 30A, the delay quantity controlling circuit 40A for controlling the variable delay circuit 30A, the delay quantity setting circuit 50A and the control signal generation circuit 60A. The variable delay circuit 30A, the delay quantity controlling circuit 40A, the delay quantity setting circuit 50A and the control signal generation circuit 60A in FIG. 9 have exactly the same circuit construction as the delay quantity controlling circuit 40, the delay quantity setting circuit 50 and the control signal generation circuit 60 shown in FIG. 5, respectively. It is possible to omit these circuits and to render only the fall timing of the word line variable, and the cycle time can be shortened by so doing to a certain extent.

Figure 10:
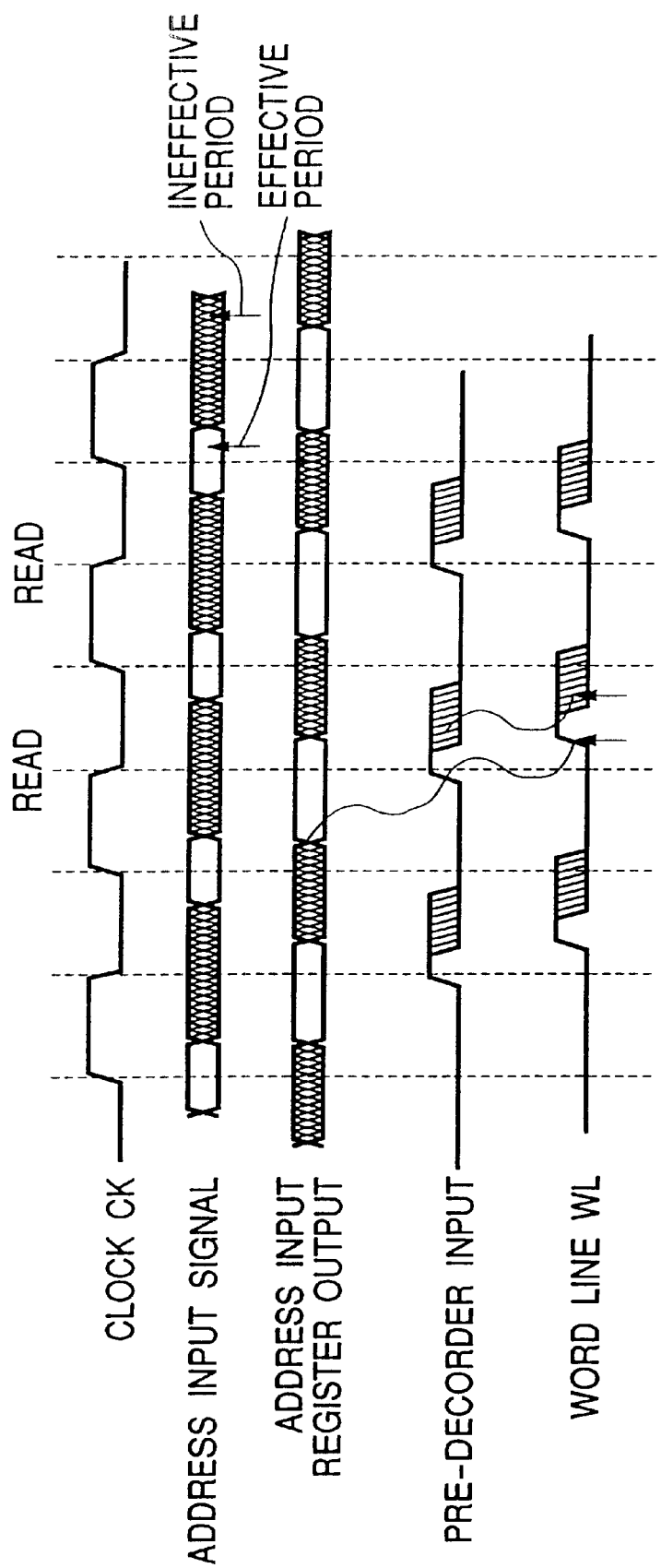
FIG. 10 is a time chart showing the change of signals in a data read operation of the synchronous SRAM in the second embodiment.

In the synchronous SRAM of this embodiment, the fall timing of the input signal to the pre-decoder 12u is rendered variable on the basis of the output signal of the address register 11u as shown in FIG. 10. Therefore, the fall timing of the word line, that is determined by the; output signal to the pre-decoder 12u, can be changed by the impressed voltages to the pads P1 to P3 of the delay quantity controlling circuit 40B or by programming of the fuses of the delay quantity setting circuit 50B. The fall timing of the word line that can shorten the cycle time to maximum is first determined in the probe test of the wafer and then the condition of the fuses of the delay quantity setting circuit 50B is so decided and programmed as to achieve this fall timing, in the same way as the adjustment of the rise timing of the control signal SALAT for the latch type amplifier L-AMP explained with reference to the flowchart of FIG. 8.

Figure 11:
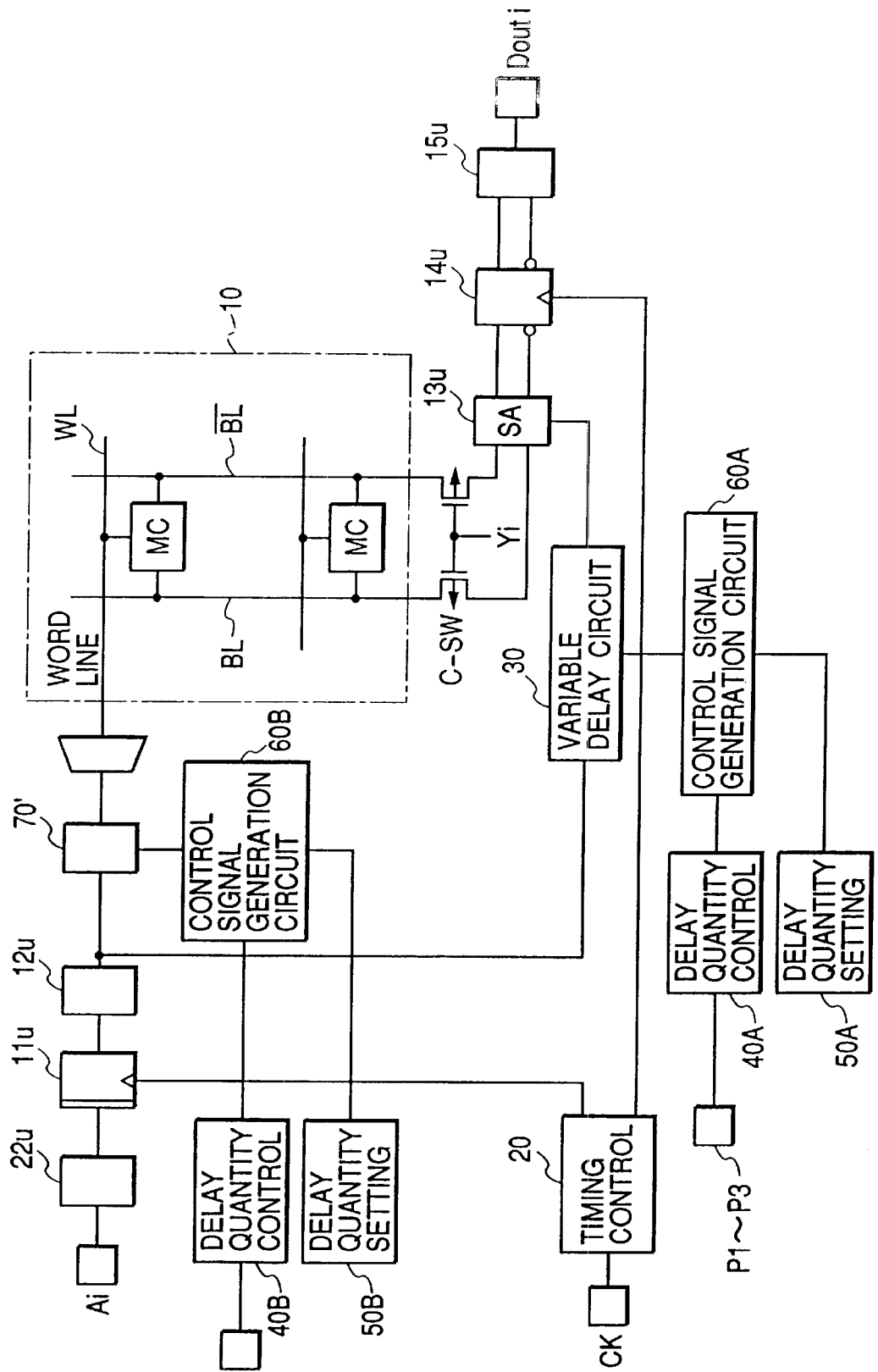
FIG. 11 is a block diagram showing a schematic structural example of a synchronous SRAM of the third embodiment to which the present invention is applied.

FIG. 11 shows a synchronous SRAM according to the third embodiment of the present invention. The third embodiment disposes a circuit similar to the variable pulse generation circuit 70 interposed between the address register 11u and the address pre-decoder 12u in the second embodiment shown in FIG. 9 on the output side of the pre-decoder 12u in place of the variable pulse generation circuit 70. In this embodiment, the variable pulse generation circuit 70' renders variable the fall timing of the signal supplied by the variable pulse generation circuit 70' from the pre-decoder 12u to the main decoder and the word driver. Therefore, the decode signal having a variable pulse width is generated. The synchronous SRAM of this embodiment includes the second delay quantity controlling circuit 40B for testing the memory by changing the pulse width in this variable pulse generation circuit 70', the second delay quantity setting circuit 50B for setting the delay quantity on the basis of the test result and the second control signal generation circuit 60B.

Figure 12:
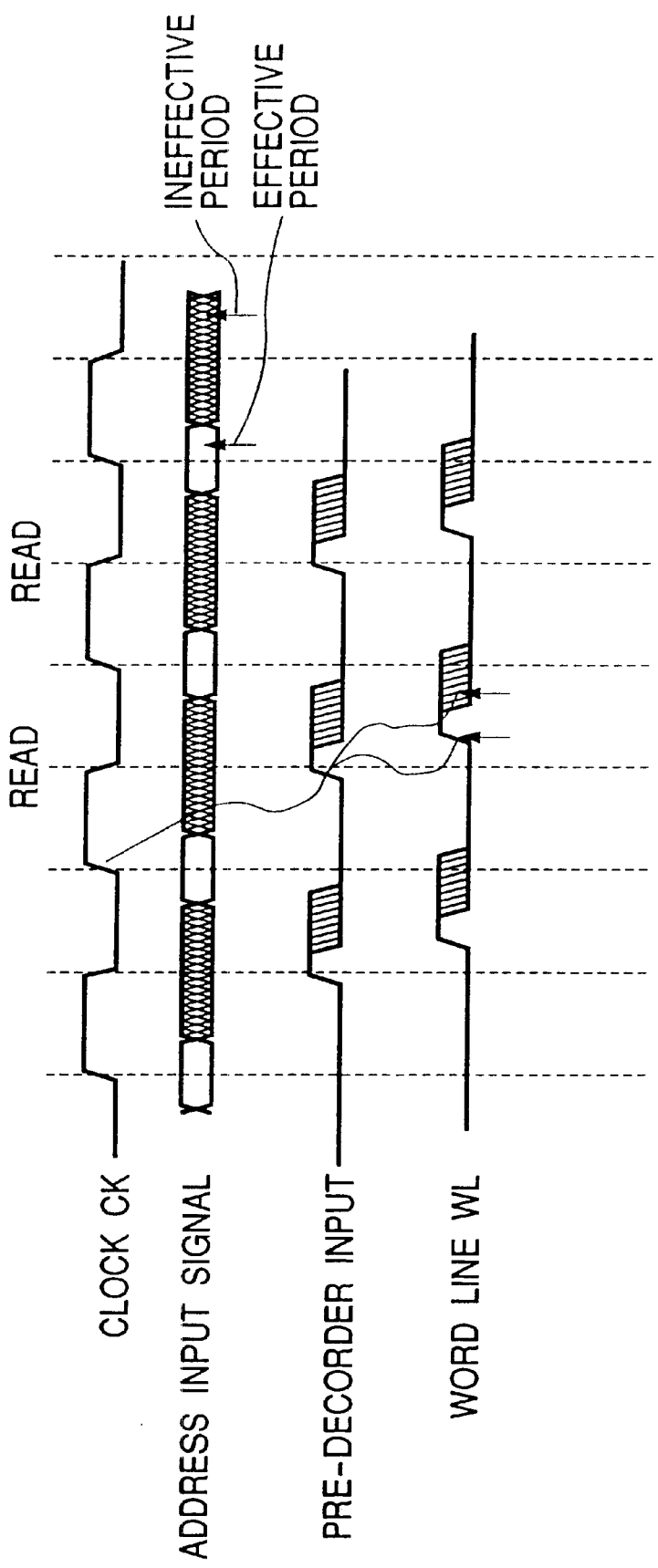
FIG. 12 is a time chart showing the change of signals in a data read operation of the synchronous SRAM in the third embodiment.

In the synchronous SRAM of this embodiment, the variable pulse generation circuit 70' is disposed on the output side of the pre-decoder 12u. Therefore, the fall timing of the word line, that is determined by the output signal of the pre-decoder 12u, can be varied by means of the impressed voltages to the pads P1 to P3 of the delay quantity controlling circuit 40B or programming of the fuses of the delay quantity setting circuit 50B, as shown in FIG. 12. Accordingly the cycle time of the money can be shortened.

This embodiment includes the variable pulse generation circuit 70' capable of varying the fall timing of the word line. However, the cycle time of the memory is affected not only by the fall timing of the word line but also by the OFF timing of the column switch C-SW. In other words, when the word line rises and the column switch C-SW is under the select state (or Qy is ON), the signal of the bit lines is outputted to the common bit line and hinders recovery of the common bit line. Therefore, when the OFF timing of the column switch is adjusted, recovery can be sped up and eventually, the cycle time can be sped up.

Therefore, a variable delay circuit for changing the fall timing of a Y decode signal Yi for controlling the MOSFET Qy1 and Qy2 of the column switch may be disposed, as well. In such a case, this fall timing may be adjustable independently of the fall timing of the word line. Since the fall timing of the Y decode signal Yi may be adjusted in the same tendency as the fall timing of the word line, however, the delay quantity controlling circuit 40B, the delay quantity setting circuit 50B and the control signal generation circuit 60B may be used in common in order to avoid a drastic increase of the delay circuits, and so forth.

Figure 13:
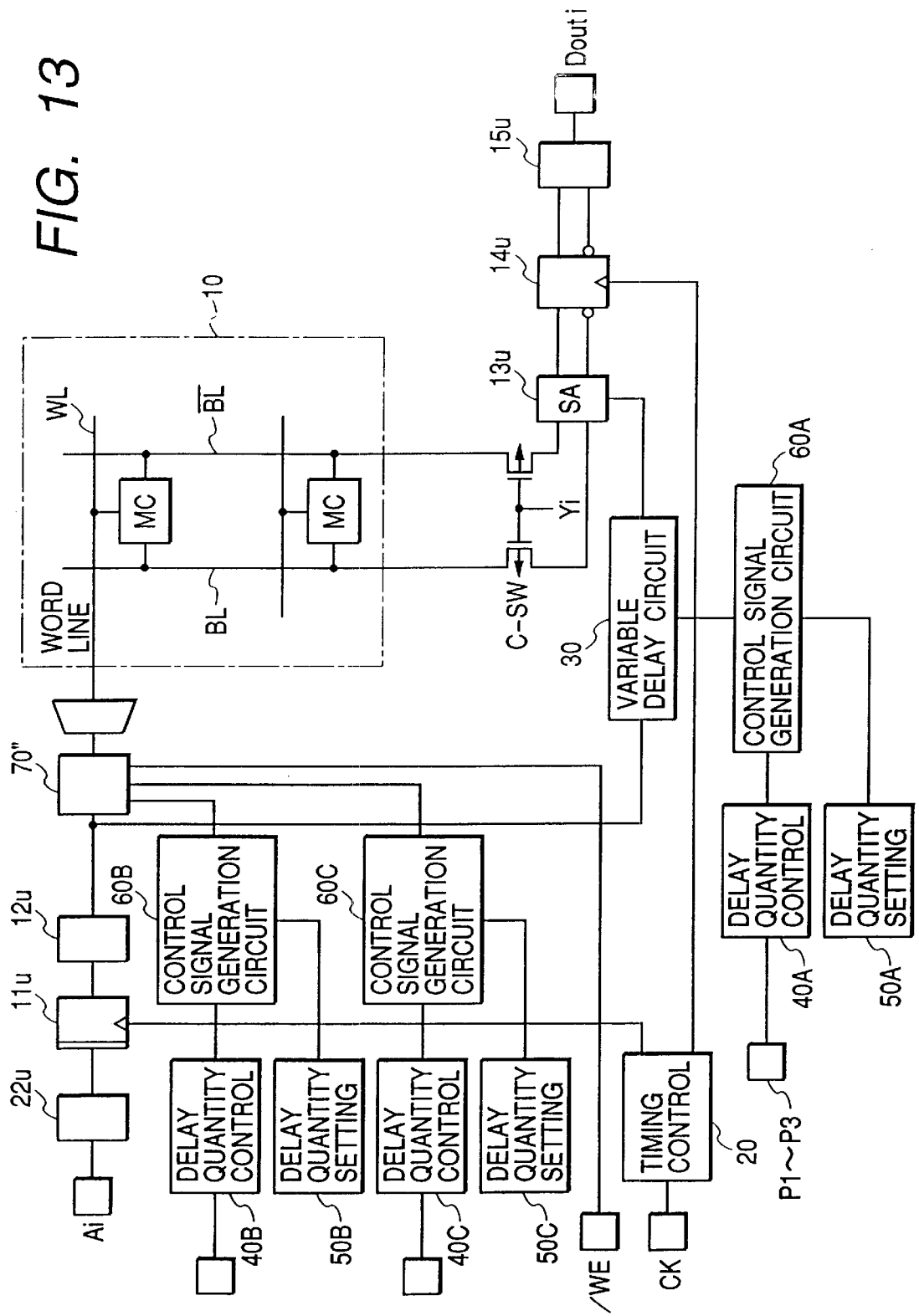
FIG. 13 is a block diagram showing a schematic structural example of a synchronous SRAM of the fourth embodiment to which the present invention is applied.

FIG. 13 shows a synchronous SRAM according to the fourth embodiment of the present invention. In this fourth embodiment, a variable pulse generation circuit 70" is disposed on the output side of the pre-decoder 12u in the same way as in the third embodiment shown in FIG. 11. This variable pulse generation circuit 70" changes the fall timing of the word line between the data read operation and the data write operation. In other words, the condition of the bit line in the SRAM after the write operation is greatly different from the condition of the bit line after the read operation. Therefore, the bit line after the write operation must drive the power source voltage of the memory cell for writing the data to the memory cell to the full amplitude of the CMOS logic such as 1.8 V or 2.5 V. In contrast, only a relatively small amplitude appears on the bit line in the case of the read operation. For this reason, the recovery period or the preparation time for the next read operation is generally longer after the write operation than after the read operation.

In the case of the read operation, it is necessary to wait for expansion of the amplitude by a relatively small read current of the memory cell, and a longer word line select time is necessary for the read operation than for the write operation. In the write operation, therefore, the word line select time is made shorter than in the read operation and the equalization time necessary for recovery is made longer instead. In the read operation, the width of the word line signal is made longer than in the write operation and the recovery time that can be finished within a shorter time is set to a shorter time. In this way, the necessary cycle time required as a whole can be shortened. In other words, if the word line select time in the read operation and the word line select time in the write operation can be adjusted independently of each other, the cycle time can be shortened to maximum.

Figure 14:
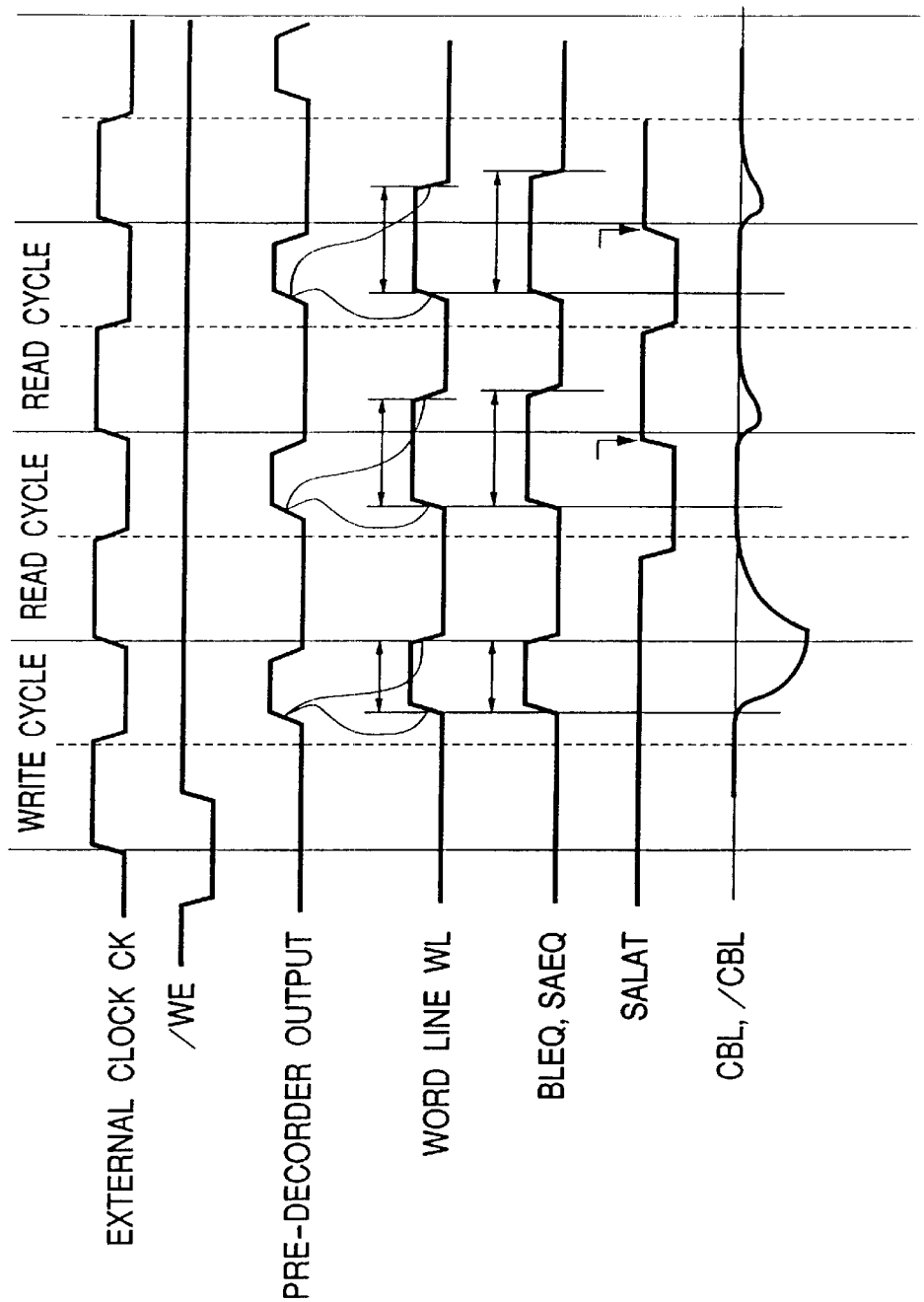
FIG. 14 is a time chart showing the change of signals in data write and read operations of the synchronous SRAM in the fourth embodiment.

In this fourth embodiment, the control signal /WE representing the data read or write operation is supplied to the variable pulse generation circuit 70" through the buffer 21u so that the pulse width (select time) can be changed between the data read operation and the data write operation as shown in FIG. 14. To independently adjust the pulse width of the word line between the read operation and the write operation, this embodiment includes a third delay quantity controlling circuit 40C, a third delay quantity setting circuit 50C and a third control signal generation circuit 60C, each being for the write operation and corresponding to the second delay quantity controlling circuit 40B, the second delay quantity setting circuit 50B and the second control signal generation quantity 60B for the read operation, besides these circuits 40B, 50B and 60B.

Incidentally, the word line select time must be shorter in the data write operation than in the data read operation. However, since the recovery time for the bit line and the sense amplification circuit needs to be longer in the data write operation than in the data read operation, the total time or in other words, the cycle time, becomes substantially equal in the data read operation and the data write operation. In this embodiment, therefore, the cycle time is equal between the data read operation and the data write operation as shown in FIG. 14. Only the pulse width of the word line (select time) is shorter in the write operation than in the read operation, and the equalization start timing of the bit line and the sense amplification circuit, that is, the fall timing of the signals BLEQ and SAEQ for controlling the equalization MOSFET Qe1 and Qe2 is rendered quicker in the write operation than in the read operation.

The invention completed by the present invention has thus been described concretely with reference to some preferred embodiments thereof. Needless to say, however, the present invention is not particularly limited to these embodiments but can be changed or modified in various ways without departing from the scope thereof.

For example, the foregoing embodiments have been explained about the case where the timing of the word line and the equalization signal inside the memory array 10 and various signals inside the sense amplifier SA (13) is adjusted. In the synchronous semiconductor memory shown in FIG. 1, the setup and hold characteristics of the input registers 16 and 19 can be adjusted by the same method as the method of the embodiments described above. In other words, when the timing of the clock signal supplied to the input registers 16 and 19 is adjusted, the setup and hold characteristics can be changed in the stage of the wafer even after the chip is completed. Therefore, it becomes possible to let the same chip cope with various separate external specifications.

In the synchronous semiconductor memory shown in FIG. 1, the timing of the clock supplied to the output register 14 can be adjusted by the same method as the embodiments described above. When the output register characteristics such as the output clock access time (the time from the input of the external clock to the output of the data) are changed in the stage of the wafer after completion of the chip, it becomes also possible to let the same chip cope with various separate external specifications.

The embodiments given above include the variable delay circuit 30 capable of varying the rise timing of the control signal SALAT of the latch type amplifier L-AMP. However, the memory cell access time is affected not only by the rise timing of the control signal SALAT of the latch type amplifier L-AMP but also by the equalization MOSFET Qe1 of the bit line and the equalization start timing of the equalization MOSFET Qe2 of the sense amplifier. In other words, equalization of the bit line BL, the sense amplification circuit SA and the data path as the post-stage of the former must be started immediately after a certain read operation is completed. In this way, the influences on the next read operation can be suppressed to minimum. Eventually, the operation with a shorter cycle time becomes possible.

Therefore, a variable delay circuit for changing the fall timing of the control signals BLEQ and SAEQ of the equalization MOSFET Qe1 and Qe2 may be disposed, too. Since the fall timing of these control signals BLEQ and SAEQ is governed by the operation timing of the sense amplifier in this case, the fall timing may be adjusted in the same tendency as the rise timing of the control signal SALAT of the latch type amplifier L-AMP. In the embodiment shown in FIG. 4, for example, it is possible to use in common the delay quantity controlling circuit 40, the delay quantity setting circuit 50 and the control signal generation circuit 60 for the variable delay circuit for the fall timing of the equalization control signals BLEQ and SAEQ.

Speaking more strictly, it is preferred to adjust. the fall timing of the equalization control signal BLEQ of the bit line in the same tendency as the fall timing of the word line, and to adjust the fall timing of the equalization control signal BLEQ of the sense amplifier in the same tendency as the rise timing of the control signal SALAT of the latch type amplifier L-AMP. Therefore, as to the variable delay circuit of the fall timing of the equalization control signal BLEQ of the bit line in the embodiments shown in FIGS. 9 and 11, for example, the delay quantity controlling circuit 40B, the delay quantity setting circuit 50B and the control signal generation circuit 60B for the word lines are used in common. As to the variable delay circuit for the fall timing of the equalization control signal SAEQ of the sense amplifier, the delay quantity controlling circuit 40A, the delay quantity setting circuit 50A and the control signal generation circuit 60A for the control signal SALAT of the latch type amplifier L-AMP are used in common.

The equalization finish timing of the bit line, the sense amplifier and the data path as the post stage of the former is determined generally before the start of the next read operation. When offset of the sense amplifier is great, for example, the operation time of the sense amplifier can be sped up in some cases by retarding the equalization finish timing. In such a case, it is advisable to dispose a variable delay circuit for varying the rise timing of the equalization control signals BLEQ and SAEQ and the equalization finish timing is adjusted so as to speed up the operation of the sense amplifier and to shorten the memory access time.

The explanation given above has dealt mainly with the clock synchronization type static RAM as the background and the field of utilization of the invention completed by the present inventor. However, the present invention is not particularly limited to this clock synchronization type static RAM but can be utilized widely in ordinary static RAM, dynamic RAM and other semiconductor memories and semiconductor integrated circuits having such memories mounted thereto.

Figure 15:
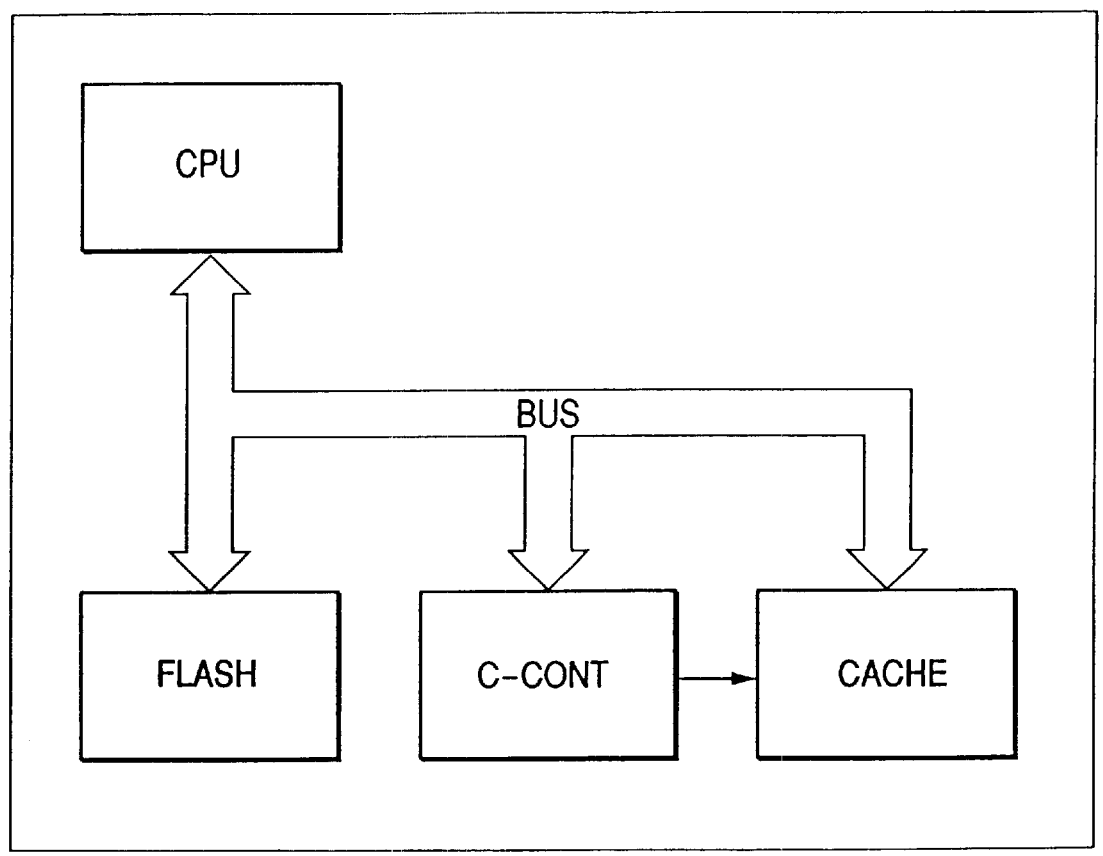
FIG. 15 is a block diagram showing a schematic construction of a microcomputer as an example of a semiconductor integrated circuit with a built-in memory.
Figure 16:
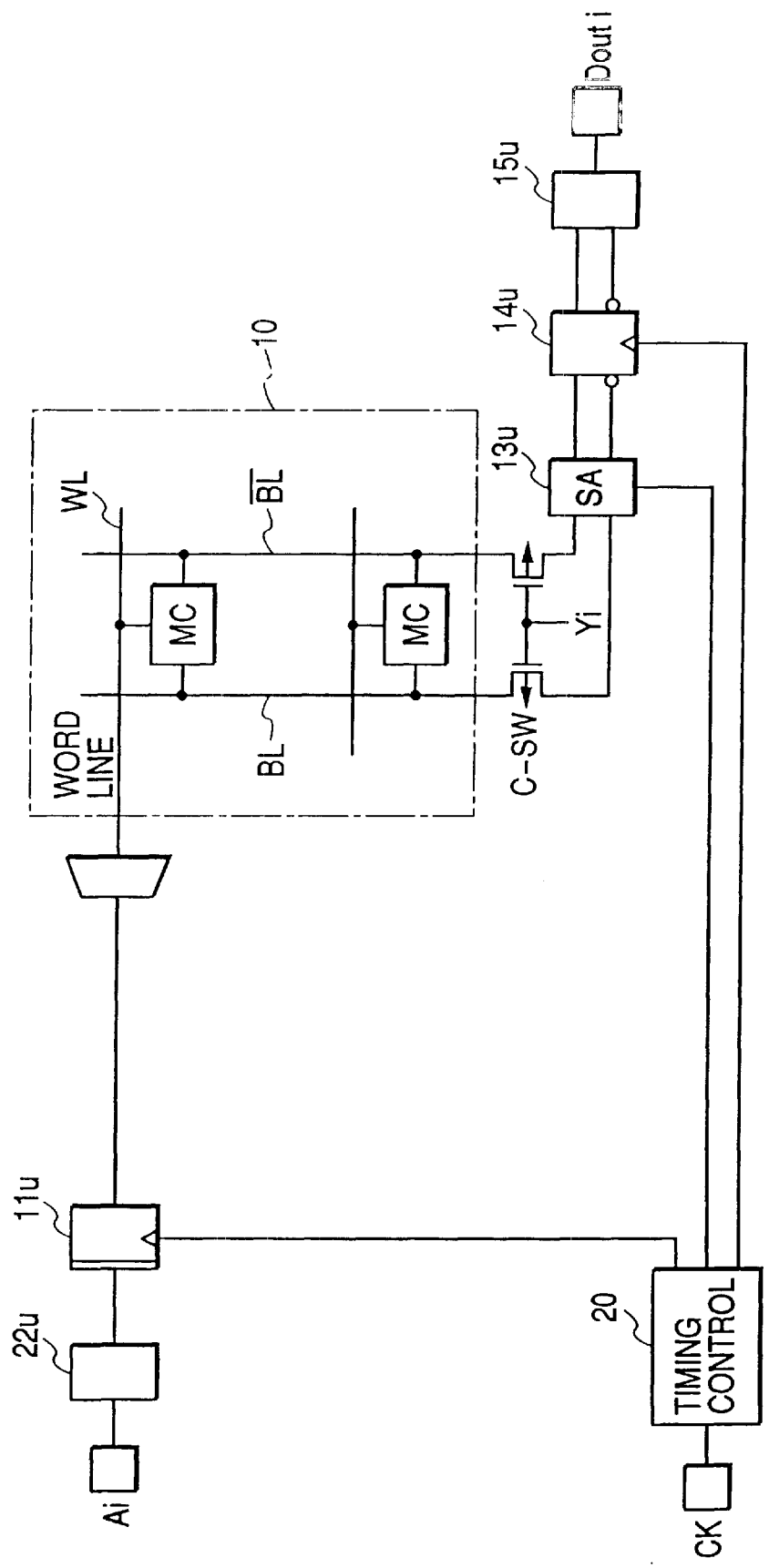
FIG. 16 is a block diagram showing a schematic structural example of a synchronous SRAM.

FIG. 15 shows a schematic construction of a microcomputer as an example of semiconductor integrated circuits with a built-in memory.

In FIG. 15, symbol CPU represents a central processing unit for serially reading the commands of programs, decoding them, executing data processing and governing the control of the chip as a whole. FLASH represents a flash memory for storing the programs executed by the CPU and various data. CACHE represents a cache memory comprising the synchronous SRAM such as one shown in FIG. 1, and functioning as a buffer memory between the central processing unit CPU and the flash memory FLASH. C-CONT represents a cache controller for comparing the address outputted from the central processing unit CPU with a tag address and controlling the cache memory such as substitution of data blocks. BUS represents a bus for connecting the central processing unit CPU, the flash memory FLASH, the cache memory CACHE and the cache controller CACC to one another.

When the microcomputer is a microcomputer such as a single chip microcomputer, it includes, in addition to the circuit blocks described above, a bus controller for controlling occupancy of the bus, a DMA transfer controlling circuit for controlling DMA (Direct Memory Access) transfer between internal memories and external memories, an interrupt controlling circuit for judging the occurrence of an interrupt request to the CPU and its priority and generating the interrupt, a serial communication interface circuit for executing serial communication with external devices, various timer circuits, an A/D conversion circuits for converting analog signals to digital signals, a watch dog timer for monitoring the system, a oscillator for generating clock signals necessary for the system operation, and so forth. These circuits are disposed, whenever necessary, and are not shown in FIG. 15. In LSI having the flash memory shown in FIG. 15, it is preferred from the aspect of the process to use the same devices as the nonvolatile memory devices constituting the flash memory in place of the fuse elements inside the delay quantity setting circuit for adjusting the activation timing of the sense amplification circuit explained in the foregoing embodiments.

The effects obtained by the typical inventions described in this application are briefly as follows.

The present invention can shorten the memory cell access time and the cycle time and can accomplish a high operation speed of the semiconductor memory. In the semiconductor memory capable of both reading and writing data, the present invention can separately optimize the cycle time of the data read operation and the cycle time of the data write operation, and can accomplish speed-up of both read cycle and write cycle.

What is claimed is:

1. A semiconductor memory device comprising:
   memory cell arrays each having a plurality of memory cells arranged in matrix, a plurality of word lines having select terminals of said memory cells of the same row connected thereto in common and a memory array having a plurality of bit lines having data input/output terminals of said memory cells of the same column connected thereto in common;
   a sense amplification circuit which amplifies a potential difference of at least one pair of said bit lines forming inside said memory array;
   a variable delay circuit for delaying an activation timing of the sense amplification circuit from a read timing of said memory cells thereby shorting a switching timing from a select state to a non-select state of at least one of said word lines; and
   a delay quantity setting circuit which sets a delay quantity in said variable delay circuit.

2. A semiconductor memory device according to claim 1, further comprising:
   an equalization circuit which brings said bit lines forming the pair to an equal potential after said word line is switched from the select state to the non-select state and before said word line is switched to the next select state; and
   a second variable delay circuit which adjusts an equalization start timing by said equalization circuit;
   wherein setting of the delay quantity in said second variable delay circuit is conducted in the interlocking arrangement with setting of the delay quantity in said variable delay circuit capable of adjusting the switching timing from the select state to the non-select state of said word line.

3. A semiconductor memory device according to claim 2, further comprising:
   a third variable delay circuit capable of adjusting an activation timing of said sense amplification circuit; and
   second delay quantity setting-circuits which sets the delay quantity in said variable delay circuit.

4. A semiconductor memory device according to claim 3, wherein said sense amplification circuit includes a positive feedback type amplification circuit which amplifies the potential difference of said bit line pair and holding the potential difference so amplified, and the activation timing of said sense amplification circuit is a latch timing of said positive feedback type amplification circuit.

5. A semiconductor memory device according to claim 4, wherein said sense amplification circuit includes:
   a differential type amplification circuit which amplifies the potential difference of said bit line pair;
   a positive feedback type amplification circuit capable of amplifying the signal amplified by said differential type amplification circuit and holding the signal so amplified; and
   an equalization circuit which brings the differential outputs of said differential type amplification circuit to an equal potential; and
   a fourth variable delay circuit which adjusts the equalization start timing by said equalization circuit.

6. A semiconductor memory device according to claim 5, wherein setting of the delay quantity in said fourth variable delay circuit is conducted in the interlocking arrangement with setting of the delay quantity in said third variable delay circuit capable of adjusting the activation timing of said sense amplification circuit.

7. A semiconductor memory device according to claim 1, further comprising:
   a second variable delay circuit capable of adjusting an activation timing of said sense amplification circuit; and
   second delay quantity setting-circuits which sets the delay quantity in said variable delay circuit.

8. A semiconductor memory device according to claims 7, wherein said sense amplification circuit includes a positive feedback type amplification circuit which amplifies the potential difference of said bit line pair and holding the potential difference so amplified, and the activation timing of said sense amplification circuit is a latch timing of said positive feedback type amplification circuit.

9. A semiconductor memory device according to claim 8, wherein said sense amplification circuit includes:
   a differential type amplification circuit which amplifies the potential difference of said bit line pair;
   a positive feedback type amplification circuit capable of amplifying the signal amplified by said differential type amplification circuit and holding; the signal so amplified; and
   an equalization circuit which brings the differential outputs of said differential type amplification circuit to an equal potential; and
   a third variable delay circuit which adjusts the equalization start timing by said equalization circuit.

10. A semiconductor memory device according to claim 9, wherein setting of the delay quantity in said third variable delay circuit is conducted in the interlocking arrangement with setting of the delay quantity in said second variable delay circuit capable of adjusting the activation timing of said sense amplification circuit.

11. A semiconductor integrated circuit having said memory device according claim 1 and a controller for executing a processing relating to the data write and read operations to and from said memory device, wherein said memory device and the controller are mounted to the same semiconductor integrated circuit chip.

12. A semiconductor memory device including memory cell arrays each including a plurality of memory cells arranged in matrix, a plurality of word lines having select terminals of said memory cells of the same row connected thereto in common, a memory array having a plurality of bit lines having data input/output terminals of said memory cells of the same column connected thereto in common, and a sense amplification circuit for amplifying a potential difference of at least one pair of said bit lines forming inside said memory array, each of said memory arrays comprising a plurality of memory mats each having a sense amplification circuit, wherein a variable delay circuit for delaying an activation timing of each of said sense amplification circuits from a read timing of said memory cells thereby shorting a switching timing from a select state to a non-select state of at least one of said word lines, the variable delay circuit is disposed in the proximity of each of said memory mats in such a manner as to correspond to said memory mat, and said semiconductor memory device further includes common delay quantity setting circuit which sets setting the delay quantity in said variable delay circuits.

13. A semiconductor memory device according to claim 12, wherein said sense amplification circuit includes a positive feedback type amplification circuit capable of amplifying the potential difference of said bit line pair and holding the potential difference, and the activation timing of said sense amplification circuit is a latch timing of said positive feedback type amplification circuit.

14. A semiconductor memory device according to claim 13, wherein said sense amplification circuit includes:
  a differential type amplification circuit which amplifies the potential difference of said bit line pair;
  a positive feedback type amplification circuit capable of amplifying the signal amplified by said differential type amplification circuit, and holding the signal so amplified;
  an equalization circuits which brings the differential outputs of said differential type amplification circuit to an equal potential; and
  a second variable delay circuit which adjusts an equalization start timing by said equalization circuit.

15. A semiconductor memory device according to claim 14, wherein setting of the delay quantity in said second variable delay circuit is conducted in the interlocking arrangement with setting of the delay quantity in said variable delay circuit capable of adjusting the activation timing of said sense amplification circuit.

16. A semiconductor memory device according to claim 15, further comprising:
  a third variable delay circuit capable of adjusting the switching timing from the select state to the non-select state of said word line; and
  second delay quantity setting circuit which sets the delay quantity in said variable delay circuit.

17. A semiconductor memory device according to claim 16, further comprising:
  an equalization circuit which brings said bit lines forming the pair to an equal potential after said word line is switched from the select state to the non-select state and before said word line is switched to the next select state; and
  a fourth variable delay circuit which adjusts the equalization start timing by said equalization circuit;
  wherein setting of the delay quantity in said fourth variable delay circuit is conducted in the interlocking arrangement with setting of the delay quantity in said variable delay circuit capable of adjusting the switching timing from the select state to the non-select state of said word line.

18. A semiconductor memory device including memory cell arrays each having a plurality of memory cells arranged in matrix, a plurality of word lines having select terminals of said memory cells of the same row connected thereto in common and a memory array having a plurality of bit lines having data input/output terminals of said memory cells of the same column connected thereto in common, and a sense amplification circuit for amplifying potentials of a plurality of pairs of said bit lines forming inside said memory array, said semiconductor memory device comprising:
  a variable pulse generation circuit for delaying an activation timing of the sense amplification circuit from a read timing of said memory cells thereby shorting a switching timing from a select state to a non-select state of at least one of said word lines;
  first delay quantity setting circuit which sets pulse width by said variable pulse generation circuit in data read operation; and
  second delay quantity setting circuit which sets a pulse width by said variable pulse generation circuit in a data write operation.

19. A semiconductor memory device according to claim 18, further comprising:
  an equalize circuit which brings said bit lines forming the pair to an equal potential after said word line is switched from the select state to the non-select state and before said word line is switched to the next select stage; and
  a variable delay circuit which adjusts an equalization start timing by said equalization circuit;
  wherein setting of the delay quantity in said variable delay circuit is conducted in the interlocking arrangement with setting of the delay quantity in said first delay quantity setting circuit or said second delay quantity setting circuit which sets the pulse width by said variable pulse generation circuit.

20. A semiconductor memory device according to claim 18, further comprising:
  a variable delay circuit capable of adjusting an activation timing of said sense amplification circuit; and
  third delay quantity setting circuit which sets the delay quantity in said variable delay circuit.

21. A semiconductor memory device according to claim 19, further comprising:
  a second variable delay circuit capable of adjusting an activation timing of said sense amplification circuit; and
  third delay quantity setting circuit which sets the delay quantity in said variable delay circuit.

22. A semiconductor integrated circuit according to claim 21, wherein said memory device is a cache memory and said controller is a central processing unit.

23. A semiconductor memory device including memory cell arrays each having a plurality of memory cells arranged in matrix and a plurality of bit lines having select terminals of said memory cells of the same row connected thereto in common, and a sense amplification circuit for amplifying potentials of a plurality of pairs of said bit lines forming inside said memory cell array, said semiconductor memory device comprising:
  a variable delay circuit for delaying an activation timing of the sense amplification-circuit from one read timing of at least one of said memory cells thereby another read timing is immediately before the one read timing; and
  delay quantity setting circuit which sets the delay quantity in said variable delay circuit.

24. A semiconductor device comprising:
  memory arrays each including a plurality of word lines, a plurality of bit lines and a plurality of memory cells connected to said word lines and said bit lines;
  an amplification circuit connected to said plurality of bit lines;
  a first circuit which receives a first control signal for delaying an activation timing of the amplification circuit from a read timing of said memory cells thereby shorting a switching timing at which at least one of said word lines changes from a select state to a non-select state, on the basis of a first control signal; and
  a second circuit which holds and outputs said first control signal.

25. A semiconductor device according to claim 23, further comprising:

a third circuit which receives a second control signal and rendering variable the operation timing of said amplification circuit on the basis of said second control signal; and a fourth circuit which holds and outputs said second control signal.

26. A semiconductor device comprising:

a first memory array including a plurality of first word lines, a plurality of first bit lines and a plurality of first memory cells connected to said first word lines and to said first bit lines;

a second memory array including a plurality of second word lines, a plurality of second word lines and a plurality of memory cells connected to said second word lines and to said second bit lines;

a first amplification circuit connected to said plurality of first bit lines;

a second amplification circuit connected to said plurality of second bit lines;

a first circuit which receives a control signal for delaying an operation timing of said first amplification circuit from a read timing of said memory cells thereby shorting a switching timing at which at least one of said word lines changes from a select state to a non-select state, on the basis of said control signal;

a second circuit which receives said control signal for delaying an operation timing of said second amplification circuit from a read timing of said memory cells thereby shorting a switching timing at which at least one of said word lines changes from a select state on-select state, on the basis of said control signal, and a third circuit which holds and outputs said control signal.

* * * * *